(12) United States Patent
Taniguchi et al.

(10) Patent No.: US 6,822,537 B1
(45) Date of Patent: Nov. 23, 2004

(54) SURFACE ACOUSTIC WAVE BRANCHING FILTER

(75) Inventors: Norio Taniguchi, Shiga-ken (JP); Yasunori Kishimoto, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 13 days.

(21) Appl. No.: 10/437,247

(22) Filed: May 14, 2003

(30) Foreign Application Priority Data

May 14, 2003 (JP) ........................................ 2003-135663

(51) Int. Cl.[7] .............................................. H03H 9/64
(52) U.S. Cl. ................................... 333/194; 310/313 R
(58) Field of Search ......................... 333/133, 193–196; 310/313 R, 313 B–313 D

(56) References Cited

U.S. PATENT DOCUMENTS

| | | | | |
|---|---|---|---|---|
| 3,573,673 A | * | 4/1971 | De Vries et al. ............ | 333/194 |
| 4,365,219 A | * | 12/1982 | Nathan ........................ | 333/193 |
| 6,469,593 B2 | * | 10/2002 | Nishizawa et al. .......... | 333/133 |
| 6,566,981 B2 | * | 5/2003 | Urabe et al. ................ | 333/193 |

FOREIGN PATENT DOCUMENTS

| | | |
|---|---|---|
| JP | 5-167389 | 7/1993 |
| JP | 8-18393 | 1/1996 |
| JP | 2003-51713 | 2/2003 |

* cited by examiner

*Primary Examiner*—Timothy P. Callahan
*Assistant Examiner*—Terry L. Englund
(74) *Attorney, Agent, or Firm*—Keating & Bennett, LLP

(57) ABSTRACT

A surface acoustic wave branching filter includes a first surface acoustic wave filter chip having a relatively low center frequency and a second surface acoustic wave filter chip having a relatively high center frequency which are joined to a chip mounting surface of a packaging member. A bump of the second surface acoustic wave filter chip is joined to a signal wiring pattern disposed on the chip mounting surface of the packaging member. The signal wiring pattern is configured to have a pattern portion that is in closer proximity to a ground wiring pattern than to the bump.

16 Claims, 20 Drawing Sheets

SURFACE ACOUSTIC WAVE BRANCHING FILTER

BACKGROUND OF THE INVENTION

1. Field of the Invention

The present invention relates to surface acoustic wave branching filters for use as branching filters that are connected to, for example, antenna portions of wireless communication apparatuses. More specifically, the present invention relates to a surface acoustic wave branching filter having a structure in which first and second surface acoustic wave filter chips having different center frequencies are joined via bumps provided on the surface acoustic wave filter chips, to a wiring pattern provided on a packaging member.

2. Description of the Related Art

In recent years in order to achieve further miniaturization, various branching filters using surface acoustic wave filters have been under development for use in compact wireless communications apparatuses, such as portable telephones.

In this type of surface acoustic wave filter branching filter, first and second surface acoustic wave filters having different center frequencies are mounted in a package. There is a strong demand for more secured isolation between the first and second surface acoustic wave filters.

One example of structures for improving the isolation is disclosed in Japanese Unexamined Patent Application Publication No. 5-167389 (Patent Document 1). Thus, as shown in FIG. 19, in a surface acoustic wave branching filter 201 described in Patent Document 1, first and second surface acoustic wave filter chips 203 and 204 are mounted in a packaging member 202. The packaging member 202 has signal input/output terminals C1, C2, D1, and D2. The first surface acoustic wave filter chip 203 has signal input/output terminals A1 and A2, and the second surface acoustic wave filter chip 204 has signal input/output terminals B1 and B2. The signal input/output terminals A1, A2, B1, B2, C1, C2, D1, and D2 are arranged such that a signal line connecting the signal input/output terminals A1, A2, and C2 and a signal line connecting the signal input/output terminals B1, B2, and D2 are arranged along two straight lines (X, Y) that cross each other at substantially right angles. With such an arrangement of the signal input/output terminals, inductive coupling is suppressed between the plurality of signal lines and the isolation is improved.

Meanwhile, Japanese Unexamined Patent Application Publication No. 8-18393 (Patent Document 2) teaches a branching-filter package shown in FIG. 20. In this case, first and second surface acoustic wave filter chips 212 and 213 are accommodated in a branching-filter package 211 having a multilayer structure. Striplines 214 and 215 are embedded in the branching-filter package 211 to constitute phase matching circuits. The characteristic impedances of the striplines 214 and 215 are greater than the characteristic impedance of an external circuit that is connected to the branching-filter package. In addition, at least two ground terminals are provided in the package for one surface acoustic wave filter chip, thereby improving the attenuation.

In a surface acoustic wave branching filter disclosed in Japanese Unexamined Patent Application Publication No. 2003-51731 (Patent Document 3), surface acoustic wave chips that constitute first and second surface acoustic wave filters are accommodated in a package. In this case, the first and second surface acoustic wave filters are electrically connected to terminal electrodes arranged in the package using bonding wires. In this surface acoustic wave branching filter, a bonding wire that is connected to a signal terminal and a bonding wire that is connected to a ground terminal cross each other in the first surface acoustic wave filter, thereby improving the isolation and attenuation.

In the configuration described in Patent Document 1, the signal lines of the first and second surface acoustic wave filter chips are arranged in a manner described above to suppress mutual inductive coupling therebetween. However, with this arrangement, although the mutual inductance can be suppressed to some extent, the suppression is still not enough. Thus, with the surface acoustic wave branching filter 201, the isolation between the first and second surface acoustic wave filter chips is not sufficient.

Additionally, when a mounting displacement between the first and second surface acoustic wave filter chips occurs, there is a problem in that the attenuation and isolation characteristics deteriorate to a great extent.

Meanwhile, for the configuration described in Patent Document 2, when it is applied to a flip-chip-bonding system packaging structure having low inductance components, the attenuation cannot be sufficiently improved because of its low inductance components.

The surface acoustic wave branching filter described in Patent Document 3 achieves cancellation of current due to mutual inductance, by crossing the bonding wires. This structure, however, makes it difficult to achieve miniaturization of a surface acoustic wave branching filter because of the use of bonding wires.

SUMMARY OF THE INVENTION

In order to overcome the problems described above, preferred embodiments of the present invention provide a surface acoustic wave branching filter that has first and second surface acoustic wave filter chips mounted with bumps in a packaging member by a flip-chip bonding system, that allows miniaturization, that further improves isolation between the surface acoustic wave filter chips, that achieves a favorable attenuation characteristic, and that has small characteristic variations due to mounting displacement of the surface acoustic wave filter chips.

According to a first preferred embodiment of the present invention, a surface acoustic wave branching filter includes a first surface acoustic wave filter chip having a relatively low center frequency and a second surface acoustic wave filter chip having a relatively high center frequency which are joined using a plurality of bumps provided on the first and second surface acoustic wave filter chips to wiring patterns disposed on a chip-mounting surface of a packaging member. The surface acoustic wave branching filter includes a first surface acoustic wave filter chip that includes a plurality of SAW resonators and that has a plurality of bumps on the lower surface, a second surface acoustic wave filter chip that includes a plurality of SAW resonators and that has a plurality of bumps on the lower surface, and a packaging member to which the first and second surface acoustic wave filter chips are joined using the plurality of bumps. The chip mounting surface of the packaging member has, at least, a signal wiring pattern that is connected to an output end of the second surface acoustic wave filter chip and a ground wiring pattern that is connected to a ground potential of a SAW resonator that is in closest proximity to the output end of the second surface acoustic wave filter chip. The chip mounting surface has a signal via hole electrode and a ground via hole electrode which are connected to the signal wiring pattern and the ground wiring pattern, respectively, and which penetrate at least one portion of the packaging member. The signal wiring pattern is configured to have a pattern portion that is in closer proximity to the ground wiring pattern than to the bump, joined to the signal wiring pattern, of the second surface acoustic wave filter chip.

In the first preferred embodiment of the present invention, the signal wiring pattern is bent so as to be in close proximity to the ground wiring pattern. Thereby, the signal wiring pattern has a pattern portion that is in close proximity to the ground electrode pattern.

In the first preferred embodiment of the present invention, the signal wiring pattern has first, second, and third wiring pattern portions. The first wiring pattern portion extends substantially parallel to an edge of the ground wiring pattern at a portion in close proximity to the ground wiring pattern. The second and third wiring pattern portions are bent from two opposite ends of the first wiring pattern portion in a direction spaced away from the ground wiring pattern.

In the first preferred embodiment of the present invention, the first wiring pattern portion and the second and third wiring pattern portions are arranged to form substantially right angles, so that the signal wiring pattern has a substantially U shape.

In the first preferred embodiment of the present invention, at the second or third wiring pattern portion, the signal wiring pattern is electrically connected to the output end of the second surface acoustic wave filter chip via the bump.

According to a second preferred embodiment of the present invention, a surface acoustic wave branching filter includes a first surface acoustic wave chip filter having a relatively low center frequency and a second surface acoustic wave chip filter having a relatively high center frequency which are joined using a plurality of bumps provided on the first and second surface acoustic wave filter chips to wiring patterns of a chip-mounting surface of a packaging member. The surface acoustic wave branching filter includes a first surface acoustic wave filter chip that includes a plurality of SAW resonators and that has a plurality of bumps on the lower surface, a second surface acoustic wave filter chip that includes a plurality of SAW resonators and that has a plurality of bumps on the lower surface, and a packaging member to which the first and second surface acoustic wave filter chips are joined using the plurality of bumps. The chip mounting surface of the packaging member has, at least, a signal wiring pattern that is connected to an output end of the second surface acoustic wave filter chip and a ground wiring pattern that is connected to a ground potential of a SAW resonator that is in closest proximity to the output end of the second surface acoustic wave filter chip. The chip mounting surface has a signal via hole electrode and a ground via hole electrode which are connected to the signal wiring pattern and the ground wiring pattern, respectively, and which penetrate at least one portion of the packaging member. Of the distances between via hole electrodes that are arranged in the packaging member and that are connected to different potentials, the distance between the signal via hole electrode and the ground via hole electrode is a minimum.

According to a third preferred embodiment of the present invention, a surface acoustic wave branching filter includes a first surface acoustic wave filter chip having a relatively low center frequency and a second surface acoustic wave filter chip having a relatively high center frequency which are joined using a plurality of bumps provided on the first and second surface acoustic wave filter chips to wiring patterns of a chip-mounting surface of a packaging member. The surface acoustic wave branching filter includes a first surface acoustic wave filter chip that includes a plurality of SAW resonators and that has a plurality of bumps on the lower surface, a second surface acoustic wave filter chip that includes a plurality of SAW resonators and that has a plurality of bumps on the lower surface, and a packaging member to which the first and second surface acoustic wave filter chips are joined using the plurality of bumps. The chip mounting surface of the packaging member has, at least, a signal wiring pattern that is connected to an output end of the second surface acoustic wave filter chip and a ground wiring pattern that is connected to a ground potential of a SAW resonator that is in closest proximity to the output end of the second surface acoustic wave filter chip. A structure for canceling out magnetic flux is provided. When magnetic flux produced by an electrical signal flowing through the first surface acoustic wave filter chip flows in a region in which the signal wiring pattern and the ground wiring pattern are provided, the structure cancels out the magnetic flux.

In the third preferred embodiment of the present invention, in the structure for canceling out the magnetic flux, first and second via hole electrodes are arranged to penetrate at least one portion of the packaging member and are connected to the ground wiring pattern. The first and second via hole electrodes are distributed at two opposite sides of an imaginary line that connects a first bump and a second bump of a plurality of bumps that join the second surface acoustic wave filter chip to wiring patterns of the packaging member. The first bump is connected to the output end of the second surface acoustic wave filter chip and the second bump is connected to the ground potential of the SAW resonator that is in closest proximity to the output end.

In the third preferred embodiment of the present invention, in the structure for canceling out the magnetic flux, first and second via hole electrodes are arranged to penetrate a layer of at least one portion of the packaging member and are connected to the ground wiring pattern. The first and second via hole electrodes are distributed at two opposite sides of a line that connects a first bump and the center of a plurality of second bumps. The first bump is connected to the output end of the second surface acoustic wave filter chip and the second bumps is connected to the ground-side potential of the SAW resonator that is in closest proximity to the output end of the second surface acoustic wave filter chip.

In the third preferred embodiment of the present invention, the angle that is formed by a line connecting the first via hole electrode and the second bump and a line connecting the second bump and the second via hole electrode is about 90° or more.

In the third preferred embodiment of the present invention, the angle that is formed by a line connecting the first via hole electrode and the center of the plurality of second bumps and a line connecting the center of the plurality of second bumps and the second via hole electrode is about 90° or more.

In the third preferred embodiment of the present invention, a plurality of via hole electrodes including the first and second via hole electrodes is provided in the packaging member. At least one of the plurality of via hole electrodes is arranged in a region in which the second surface acoustic wave filter chip is mounted. The other via hole electrodes are arranged in a region outside the region in which the second surface acoustic wave filter chip is mounted.

In the surface acoustic wave device according to the first to third preferred embodiments of the present invention, the first and second surface acoustic wave filter chips may be configured as separated chips. In the present invention, however, the first and second surface acoustic wave filter chips may be integrated and configured as one: chip.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1A:
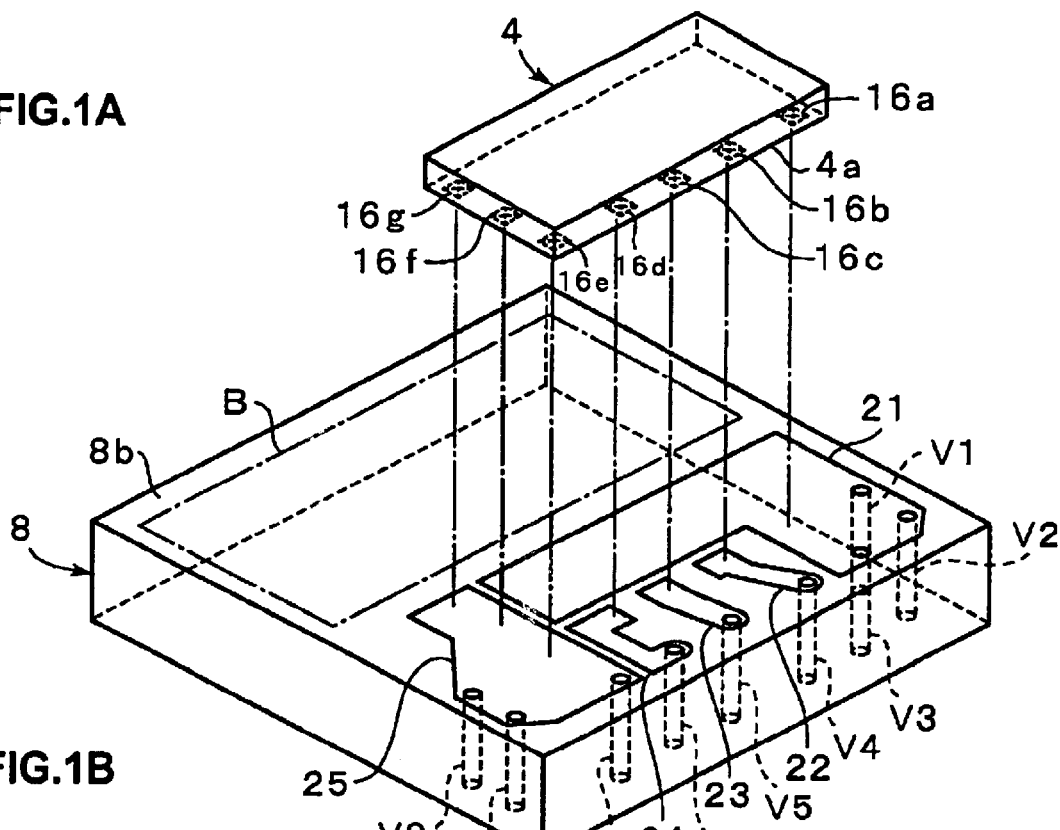
FIGS. 1(a) and 1(b) are a schematic exploded perspective view and a front sectional view, respectively, illustrating a surface acoustic wave branching filter according to a first preferred embodiment of the present invention.
Figure 1B:
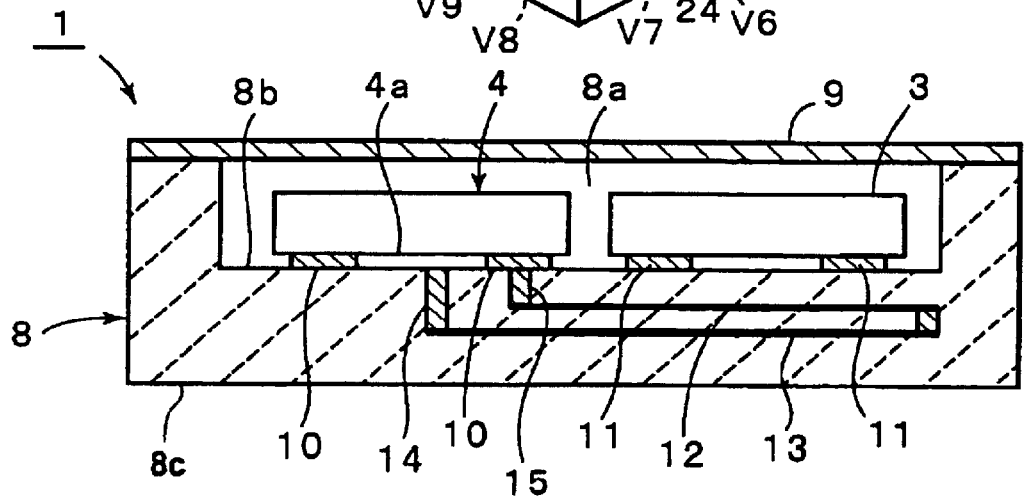
Figure 2:
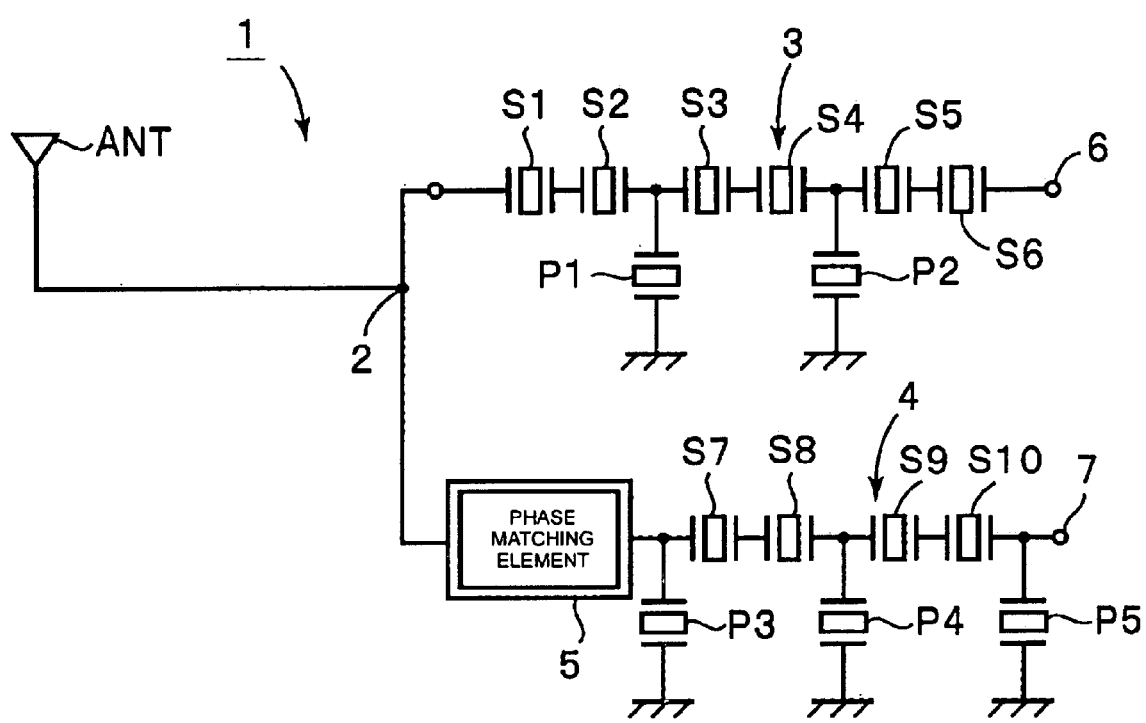
FIG. 2 is a diagram showing the circuit configuration of a surface acoustic wave branching filter according to the first preferred embodiment of the present invention.

FIGS. 1(a) and 1(b) are a schematic exploded perspective view and a front sectional view, respectively, illustrating a surface acoustic wave branching filter according to a first preferred embodiment of the present invention. FIG. 2 is a diagram showing the circuit configuration of the surface acoustic wave branching filter of this preferred embodiment of the present invention.

As shown in FIG. 2, a surface acoustic wave branching filter 1 has an antenna connection terminal 2 that is connected to an antenna ANT. A sending-side surface acoustic wave filter chip 3, which defines a first surface acoustic wave filter chip, and a receiving-side surface acoustic wave filter chip 4, which defines a second surface acoustic wave filter chip, are connected to the antenna connection terminal 2. A phase matching element 5 is connected between the antenna connection terminal 2 and the receiving-side surface acoustic wave filter chip 4.

As shown, each of the surface acoustic wave filter chips 3 and 4 has a structure in which a plurality of SAW resonators is connected to constitute a ladder circuit. More specifically, the surface acoustic wave filter chip 3 has SAW resonators S1 to S6, which define series arm resonators, and SAW resonators P1 and P2, which define parallel arm resonators, and the surface acoustic wave filter chip 4 has SAW resonators S7 to S10, which define series arm resonators, and SAW resonators P3 to P5, which define parallel arm resonators.

In FIG. 2, signal terminals which are located at opposite sides of the ANT terminal 2 of the surface acoustic wave filter chips 3 and 4 are a sending-side signal terminal 6 and a receiving-side signal terminal 7.

The SAW resonator P5 is in closest proximity to the receiving-side signal terminal 7 and has one end connected to ground potential. Herein, of the plurality of SAW resonators in the receiving-side surface acoustic wave filter chip 4, the structure of the electrode in a packaging member which is connected to the ground potential of the SAW resonator P5 is at issue. Thus, in the present invention, it is to be noted that a ground potential of a SAW resonator that is in closest proximity to the output of the second SAW filter chip refers to the ground potential of the SAW resonator P5 shown in FIG. 2.

As shown in FIG. 1(b), in the surface acoustic wave-branching filter 1, a hollow portion 8a is formed in the upper portion of a packaging member 8. The sending-side surface acoustic wave filter chip 3 and the receiving-side surface acoustic wave filter chip 4 are mounted on a chip mounting surface 8b of the packaging member. Herein, the chip mounting surface 8b of the packaging member 8 refers to the bottom surface in the hollow portion 8a. In the present invention, a flat-plate packaging member having no hollow portion 8a may be used.

In the surface acoustic wave branching filter 1, a lid member 9 is attached thereto so as to cover the hollow portion 8a of the packaging member 8.

In the surface acoustic wave branching filter 1, the sending-side surface acoustic wave filter chip 3 and the receiving-side surface acoustic wave filter chip 4 are electrically connected to various wiring patterns, which are provided on the chip mounting surface 8b of the packaging member 8 and which will be described below, using a plurality of bumps 10 and 11, which is schematically shown. Further, the surface acoustic wave filter chips 3 and 4 are joined to the chip mounting surface 8b of the packaging member 8.

The phase matching element 5 shown in FIG. 2 is defined by striplines 12 and 13 shown in FIG. 1(b). The striplines 12 and 13 are embedded in the packaging member 8 and are electrically connected to the receiving-side surface acoustic wave filter chip 4 through corresponding via hole electrodes 14 and 15.

In this type of surface acoustic wave branching filter 1, the sending-side surface acoustic wave filter chip 3 and the receiving-side surface acoustic wave filter chip 4 are arranged adjacent to each other. Thus, the magnetic flux that is produced by electrical current flowing through the sending-side surface acoustic wave filter chip 3 passes through the receiving-side surface acoustic wave filter chip 4 side. More specifically, the magnetic flux passes in a direction that is substantially perpendicular to the major surfaces of the receiving-side surface acoustic wave filter chip 4 and the chip mounting surface 8b of the packaging member 8. As a result, there are problems in that the frequency characteristics of the receiving-side surface acoustic wave filter chip 4 deteriorate and the isolation between the surface acoustic wave filter chips 3 and 4 deteriorates due to such magnetic flux.

In the surface acoustic wave branching filter 1 of the first preferred embodiment, the shape of the wiring pattern formed on the chip mounting surface 8b of the packaging member 8 is improved to prevent characteristic deterioration due to such magnetic flux. This will now be described with reference to FIGS. 1(a), 3, and 4 together.

Figure 3:
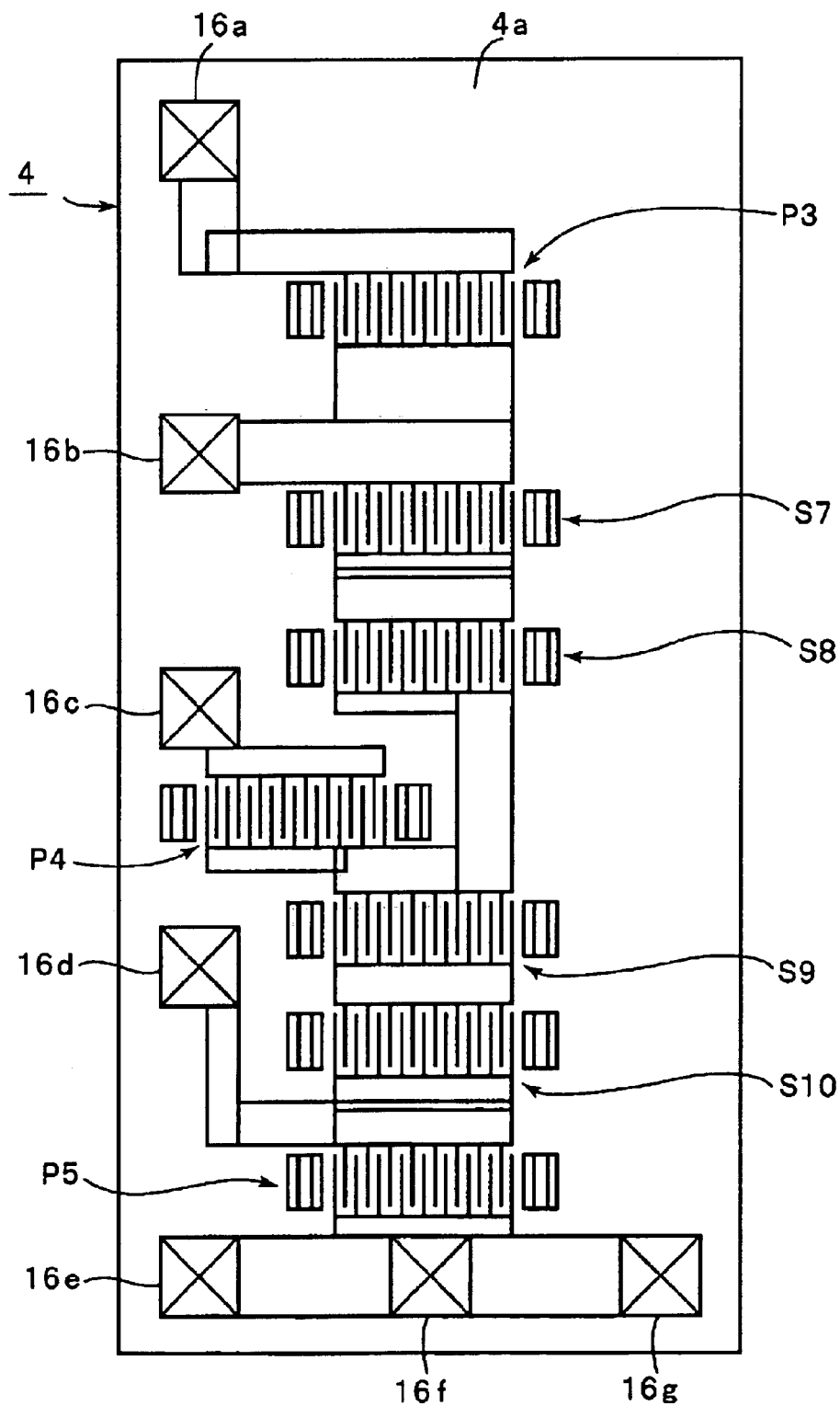
FIG. 3 is a schematic bottom view showing the structures of electrodes disposed on the lower surface of a receiving-side surface acoustic wave filter chip for use in the first preferred embodiment of the present invention

FIG. 1(a) is an exploded perspective view schematically showing a portion in which the receiving-side surface acoustic wave filter chip 4 is mounted on the chip mounting surface 8b of the packaging member 8. Various electrodes shown in FIG. 3 are provided on the lower surface of the receiving-side surface acoustic wave filter chip 4. That is, the SAW resonators S7 to S10 and P3 to P5, which are shown in FIG. 2, are disposed on the lower surface 4a of the surface acoustic wave filter chip 4. In this preferred embodiment, each of the SAW resonators S7 to S10 and P3 to P5 is defined by a one-port SAW resonator and has a structure in which reflectors are provided at two opposite sides of an IDT (interdigital transducer) in a direction in which surface acoustic waves propagate. Electrode pads 16a to 16g are also disposed on the lower surface 4a of the surface acoustic wave filter chip 4. The electrode pads 16a to 16g are provided with corresponding metal bumps, which are not shown in FIG. 3. The metal bumps correspond to, for example, metal bumps 10, which are schematically shown in FIG. 1(b), and protrude downward from the lower surface 4a of the surface acoustic wave filter chip 4.

On the chip mounting surface 8b of the packaging member 8, a plurality of wiring patterns is provided at portions joined to the above-described metal bumps. Thus, as shown in FIGS. 1(a) and 4, an antenna-side signal wiring pattern 22, an antenna-side ground wiring pattern 21, an interstage ground wiring pattern 23, a receiving-side signal wiring pattern 24, and a receiving-side ground wiring pattern 25 are provided.

The features of this preferred embodiment lie in the structures of the receiving-side signal wiring pattern 24 and the receiving-side ground wiring pattern 25.

The receiving-side signal wiring pattern 24 is a portion that is joined to the receiving-side signal terminal 7 shown in FIG. 2, i.e., the metal bump provided on the electrode pad 16d shown in FIG. 3. The receiving-side ground wiring pattern 25, on the other hand, is a portion that is joined to the ground potential of the SAW resonator P5 shown in FIG. 2, i.e., the individual bumps provided on the electrode pads 16e to 16g shown in FIG. 3.

Figure 4:
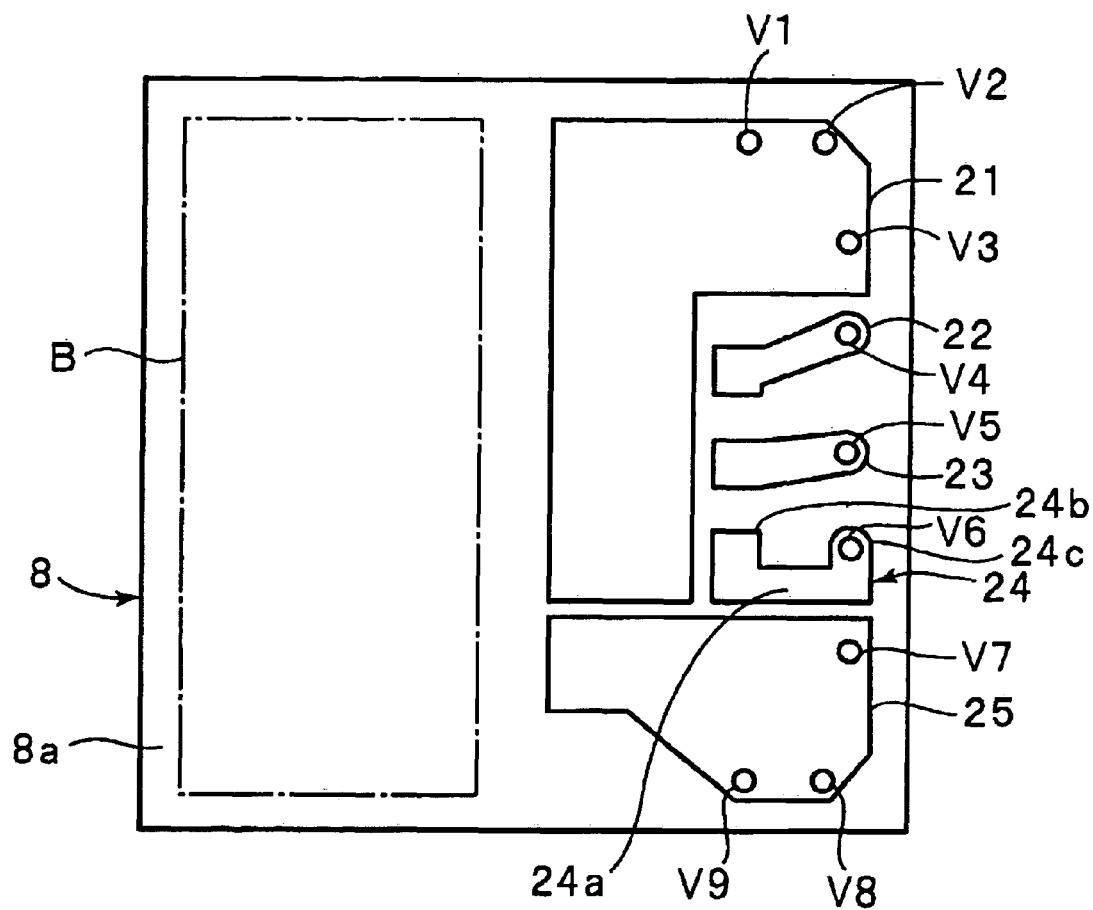
FIG. 4 is a schematic plan view illustrating a plurality of wiring patterns disposed on the upper surface of a packaging member for use in the first preferred embodiment of the present invention.

At a portion indicated by a dashed-dotted line B in FIG. 4, various wiring patterns that are connected to the sending-side surface acoustic wave filter chip 3 shown in FIG. 1(b) are disposed.

In the surface acoustic wave branching filter 1, a plurality of via hole electrodes V1 to V9 is provided in the packaging member 8. Each of the upper ends of the via hole electrodes V1 to V9 is connected to one of the wiring patterns 21 to 25. In this preferred embodiment, the via hole electrodes V1 to V9 extend so as to penetrate at least one portion of the packaging member 8 in the direction that is substantially perpendicular to the chip mounting surface 8b. The via hole electrode V4 is connected to the antenna signal wiring pattern 22 and is electrically connected to the striplines 12 and 13. The other via hole electrodes are arranged so as to extend to the lower surface of the packaging member 8 and are electrically connected to outer connection electrodes that are disposed on the lower surface of the packaging member 8.

Meanwhile, the plurality of via hole electrodes V7 to V9 is electrically connected to the receiving-side ground wiring pattern 25. Thus, the surface acoustic wave branching filter 1 also has an advantage in that the grounding is enhanced by the via hole electrodes V7 to V9.

As described above, in the surface acoustic wave branching filter 1, the sending-side surface acoustic wave filter chip 3 and the receiving-side surface acoustic wave filter chip 4 are arranged adjacent to each other. Thus, during operation, electrical signals flowing through the sending-side surface acoustic wave filter chip 3 and electrode portions on the packaging member 8 which are electrically connected to the sending-side surface acoustic wave filter chip 3 produce magnetic flux. This magnetic flux passes in the direction that is substantially perpendicular to the chip mounting surface 8b through the receiving-side surface acoustic wave filter chip 4 and the portions of the chip mounting surface 8b of the packaging member 8 at which the wiring patterns 21 to 25 are provided.

In the surface acoustic wave branching filter 1, when magnetic flux passes through, particularly, the portions at which the receiving-side signal wiring pattern 24 and the receiving-side ground wiring pattern 25 are provided, the isolation deteriorates. Accordingly, in this preferred embodiment, the receiving-side signal wiring pattern 24 is bent so as to have a substantially U-shaped configuration, as shown in FIGS. 1(a) and 4. This provides a configuration in which the receiving-side signal wiring pattern 24 has a wiring pattern portion that is in close proximity to the receiving-side ground wiring pattern 25. As a result, it is possible to suppress the influence of magnetic flux that passes through the portion between the receiving-side signal wiring pattern 24 and the receiving-side ground wiring pattern 25.

Figure 5:
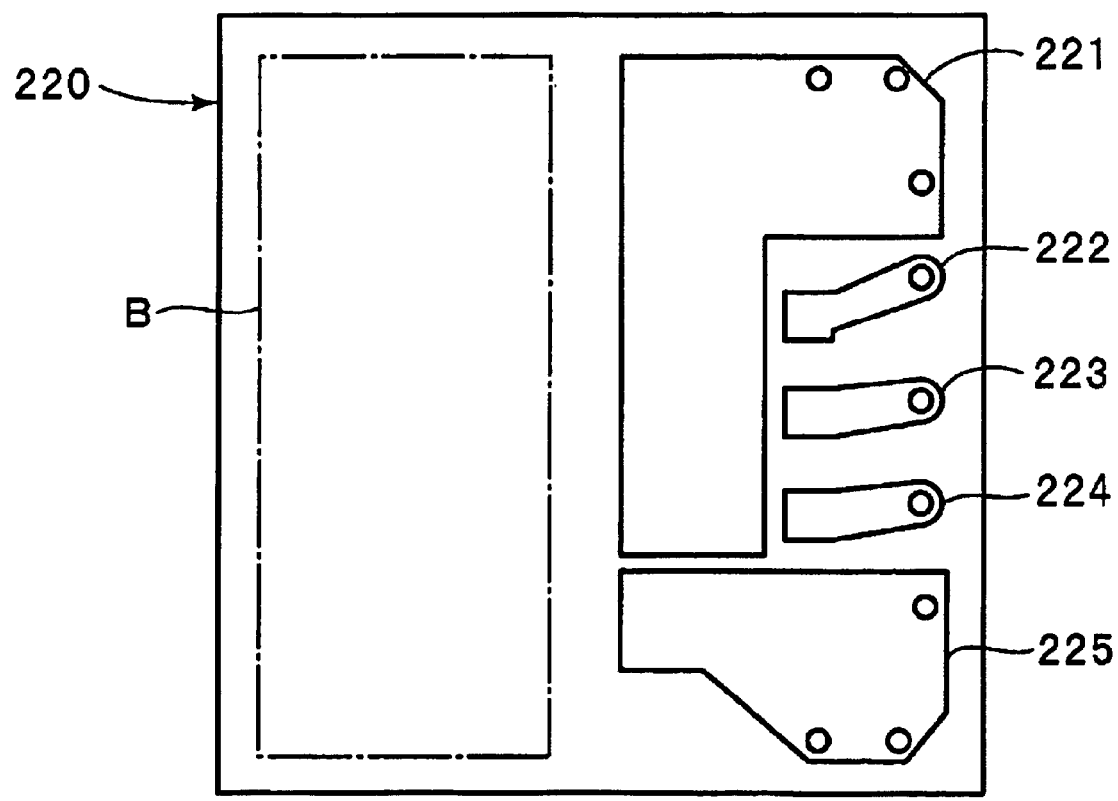
FIG. 5 is a schematic plan view illustrating conventional wiring patterns disposed on the upper surface of a packaging member in a surface acoustic wave branching filter which are used in a comparative example.

This will be described in comparison with the plane shape of the wiring pattern that is shown in FIG. 5 and that corresponds to a conventional example. FIG. 5 is a schematic plan view of a packaging member 220 prepared for the sake of comparison. In the comparative example, as in the chip mounting surface 8b of the packaging member 8, an antenna-side signal wiring pattern 222, an antenna-side ground wiring pattern 221, an interstage ground wiring pattern 223, a receiving-side signal wiring pattern 224, and a receiving-side ground wiring pattern 225 are formed on the chip mounting surface of the packaging member 220. The receiving-side signal wiring pattern 224 is spaced apart from the adjacent wiring patterns, similarly to the wiring patterns 222 and 223. As is seen from FIG. 5, the receiving-side signal wiring pattern 224 preferably has a substantially linear shape.

In contrast, in the surface acoustic wave branching filter 1 of the first preferred embodiment of the present invention, the receiving-side signal wiring pattern 24 is bent so as to have the substantially U-shaped configuration and is brought into close proximity to the receiving-side ground wiring pattern 25.

More specifically, as shown in FIG. 4, in the first preferred embodiment of the present invention, the receiving-side signal wiring pattern 24 has a first wiring pattern portion 24a, a second wiring pattern portion 24b, and a third wiring pattern portion 24c. The first wiring pattern portion 24a lies at a portion opposing the receiving-side ground wiring pattern 25 to linearly extend substantially parallel to one edge of the receiving-side ground wiring pattern 25. The second and third wiring pattern portions 24b and 24c are bent from two opposite sides of the first wiring pattern portion 24a in a direction that is substantially perpendicular to the first wiring pattern portion 24a and away from the receiving-side ground wiring pattern 25. The second and third wiring pattern portions 24b and 24c do not necessarily have to be substantially perpendicular to the first wiring pattern portion 24a, and thus may be bent so as to form an angle other than about 90°.

Figure 6:
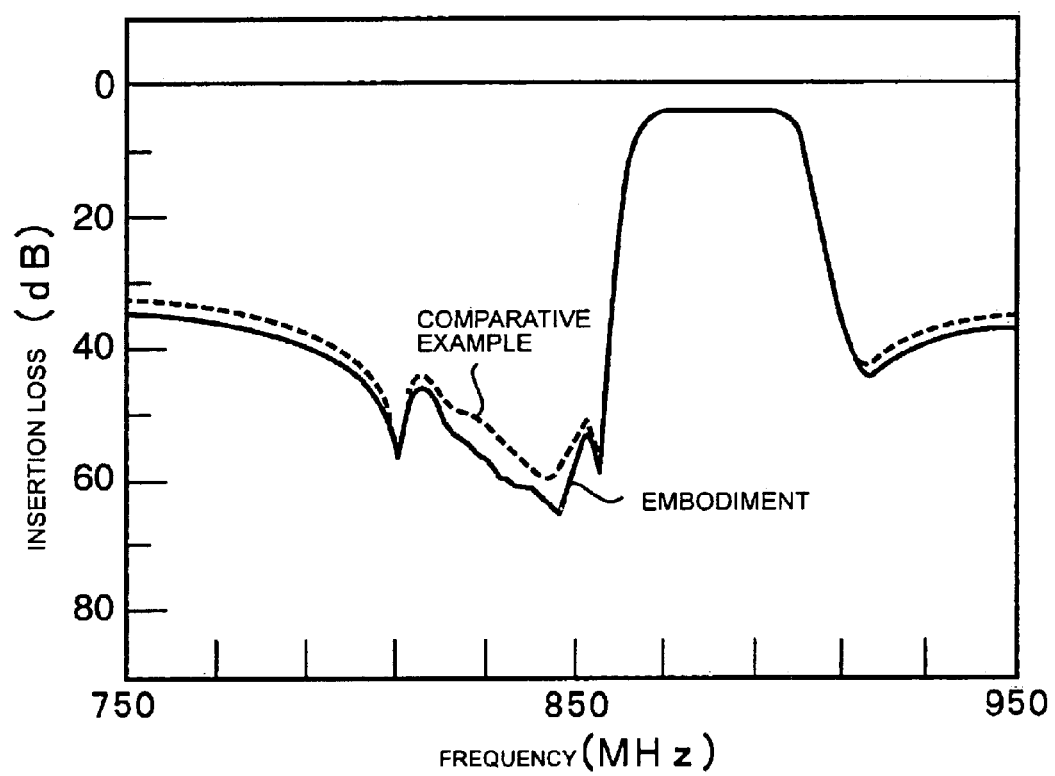
FIG. 6 is a graph showing a frequency characteristic of the receiving-side surface acoustic wave filter of the first preferred embodiment of the present invention and a frequency characteristic of a receiving-side surface acoustic wave filter of a surface acoustic wave branching filter of the comparative example.

FIG. 6 shows a frequency characteristic of the surface acoustic wave branching filter 1 of this preferred embodiment using the packaging member 8 and a frequency characteristic of a receiving-side surface acoustic wave filter chip of a surface acoustic wave branching filter of a comparative example. The surface acoustic wave branching filter of the comparative example is configured in the same manner as the surface acoustic wave branching filter 1 of this preferred embodiment, but uses the packaging member 220 shown in FIG. 5. The solid line in FIG. 6 indicates the result of the first preferred embodiment and the dotted line indicates the result of the comparative example.

Figure 7:
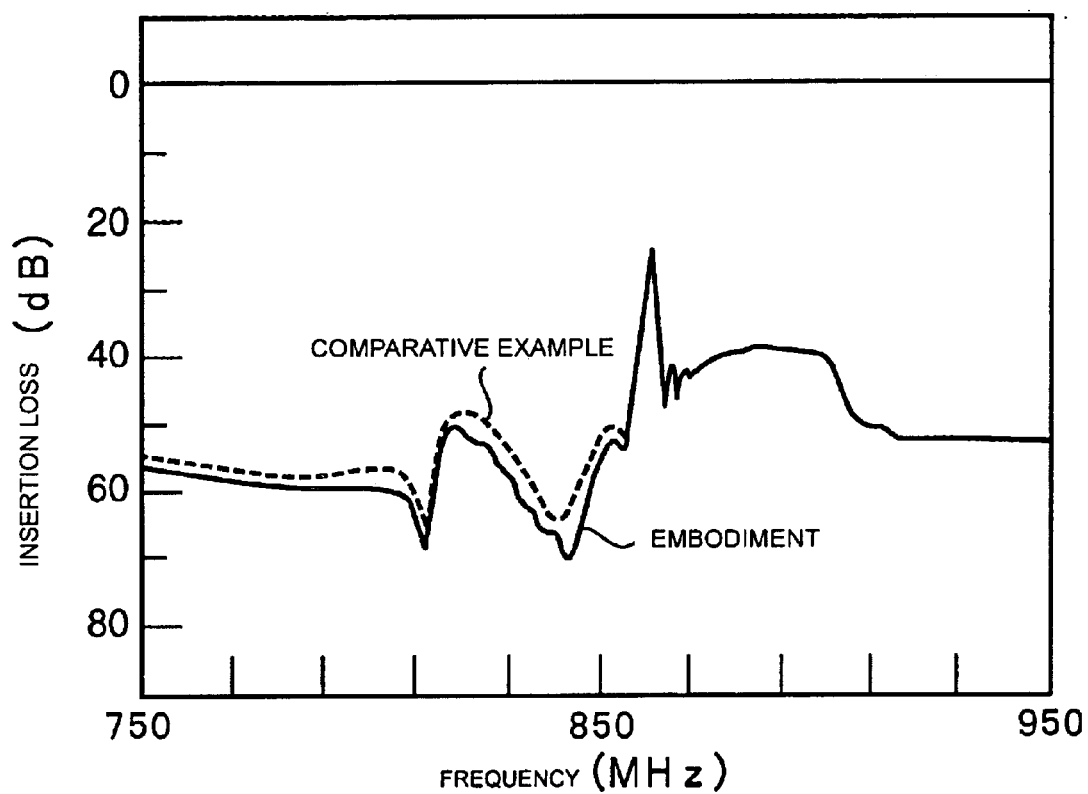
FIG. 7 is a graph showing an isolation characteristic of a surface acoustic wave branching filter of the second preferred embodiment of the present invention and an isolation characteristic of the surface acoustic wave branching filter of the comparative example.

FIG. 7 is a graph showing an isolation characteristic of the surface acoustic wave branch filter of the preferred embodiment described above and an isolation characteristic of the surface acoustic wave branching filter of the comparative example. The solid line indicates the result of the preferred embodiment and the dotted line indicates the result of the comparative example. The Tx passband of the surface acoustic wave branching filters is 824 to 849 MHz and the Rx passband thereof is 869 to 894 MHz.

As is clear from FIGS. 6 and 7, the surface acoustic wave branching filter of this preferred embodiment exhibits a favorable isolation characteristic in a band outside the passband of the receiving-side surface acoustic wave filter, compared to the surface acoustic wave branching filter of the comparative example, and thus shows a sufficient out-of-band attenuation in the frequency characteristics of the receiving-side surface acoustic wave filter chip. This appears to be because the receiving-side signal wiring pattern 24 is in close proximity to the receiving-side ground wiring pattern 25, as described above, to thereby suppress the influence of the aforementioned magnetic flux passing through a portion therebetween.

Figure 8:
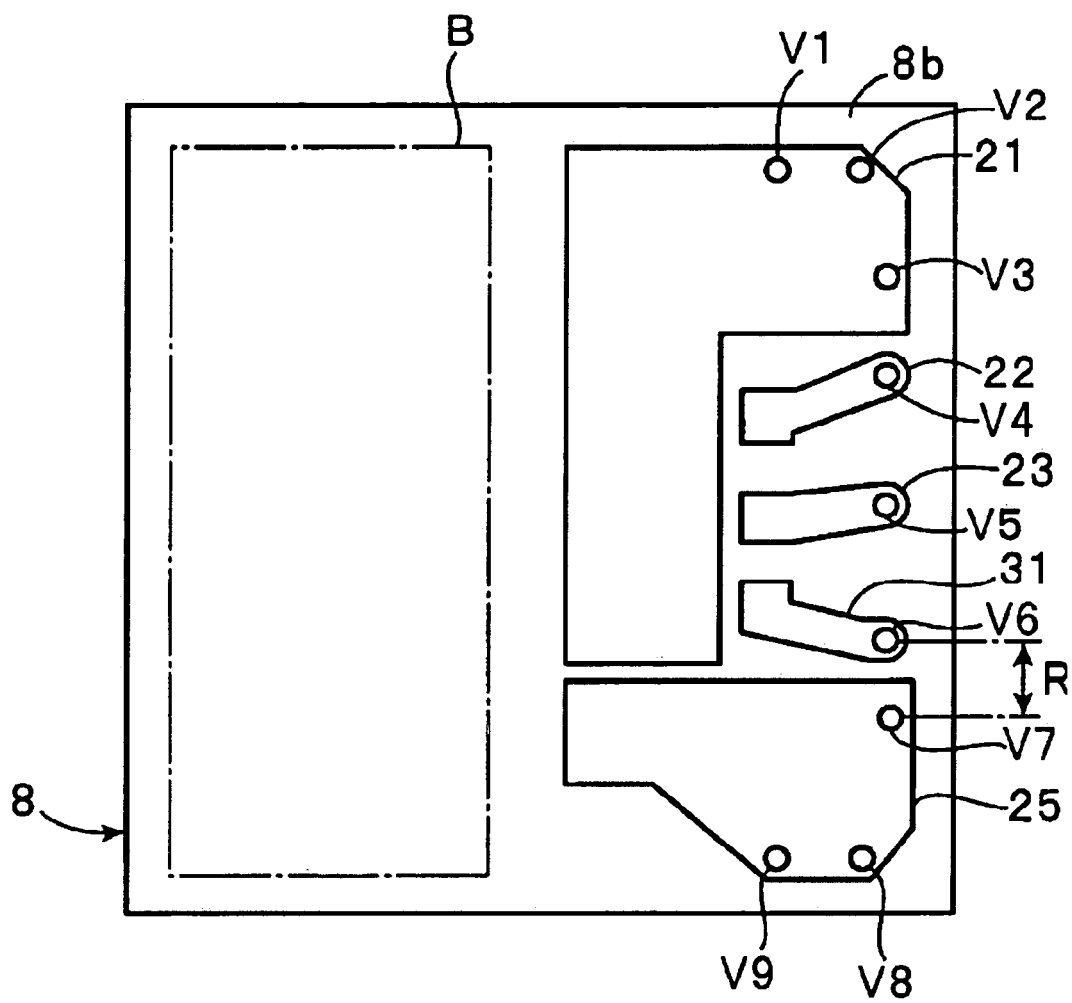
FIG. 8 is a schematic plan view illustrating a plurality of wiring patterns provided on the upper surface of a packaging member of a surface acoustic wave branching filter of the second preferred embodiment of the present invention.

FIG. 8 is a schematic plan view showing the structures of wiring patterns on the upper surface of the packaging member of a surface acoustic wave branching filter according to a second preferred embodiment of the present invention. FIG. 8 corresponds to FIG. 4 in which the first preferred embodiment is illustrated. Since other structures of the surface acoustic wave branching filter of the second preferred embodiment are analogous to those of the surface acoustic wave branching filter of the first preferred embodiment, the description thereof will be incorporated.

In the surface acoustic wave branching filter of the second preferred embodiment, as in the first preferred embodiment, the antenna-side signal wiring pattern 22, the antenna-side ground wiring pattern 21, the interstage ground wiring pattern 23, and the receiving-side ground wiring pattern 25 are arranged on the chip mounting surface 8b of the packaging member 8. While the substantially U-shaped receiving-side signal wiring pattern 24 is formed in the first preferred embodiment, a receiving-side signal wiring pattern 31 in the second preferred embodiment does not have a substantially U-shaped configuration but a linear shape.

The via hole electrode V6 is connected to the receiving-side signal wiring pattern 31 and the via hole electrodes V7 to V9 are connected to the receiving-side ground wiring pattern 25. Of the via hole electrodes V7 to V9, the via hole electrode V7 is in closest proximity to the via hole electrode V6. Of the via hole electrodes V1 to V9 that are electrically connected to the receiving-side surface acoustic wave filter chip 4, the distance R between the via hole electrode V6 and the via hole electrode V7 is set to be a minimum among the distances between via hole electrodes that are connected to different potentials. Of other pairs of adjacent via hole electrodes that are connected to different potentials, the distance between at least one pair of via hole electrodes may be the same as the distance between the via hole electrode V6 and the via hole electrode V7.

Because the distance between the via hole electrode V6 and the via hole electrode V7 is reduced as described above in this preferred embodiment, the aforementioned magnetic flux is suppressed from passing through a portion between the receiving-side signal wiring pattern 31 and the receiving-side ground wiring pattern 25. This is because, in this preferred embodiment, the via hole electrodes V6 and V7 are arranged so as to extend from the chip mounting surface 8b of the packaging member 8 to a lower surface 8c of the packaging member 8 through at least one portion of the packaging member 8. With this arrangement, a reduction in the distance between the via hole electrodes V6 and V7 suppresses the influence of the aforementioned magnetic flux therebetween.

In this manner, the influence of magnetic flux produced by a signal passing through the sending-side surface acoustic wave filter chip 3 and the electrodes of the packaging member 8 which are connected to the sending-side surface acoustic wave filter chip 3 can also be overcome by reducing the distance R between the via hole electrode V6 and the via hole electrode V7.

As described above, the via hole electrode V6 is brought into close proximity to the via hole electrode V7. In other words, at a portion in which the via hole electrode V6 is provided, the receiving-side signal wiring pattern 31 is brought into close proximity to the receiving-side ground wiring pattern 25. That is, in the surface acoustic wave branching filter of the second preferred embodiment, the receiving-side signal wiring pattern 31 also has a wiring pattern portion that is in close proximity to the receiving-side ground wiring pattern 25.

In the second preferred embodiment, because it is sufficient to bring the via hole electrode V6 into close proximity to the via hole electrode V7, the signal wiring pattern 31 does not need to have a complicated shape. However, in practice, for miniaturization, it is difficult to form a pair of via hole electrodes to be in close proximity to each other as in the via hole electrodes V6 and V7. Thus, for miniaturization of the surface acoustic wave branching filter, a portion of the receiving-side signal wiring pattern may be brought into close proximity to the receiving-side ground wiring pattern 25, as in the first preferred embodiment, to provide a structure in which the distance between the via hole electrode V6 and the via hole electrode V7 is increased compared to the second preferred embodiment. This structure facilitates the formation of the via hole electrodes V6 and V7. Thus, when the formation accuracy of the via hole electrodes is considered, the structure of the first preferred embodiment facilitates the fabrication and is thus advantageous compared to the second preferred embodiment.

Figure 9:
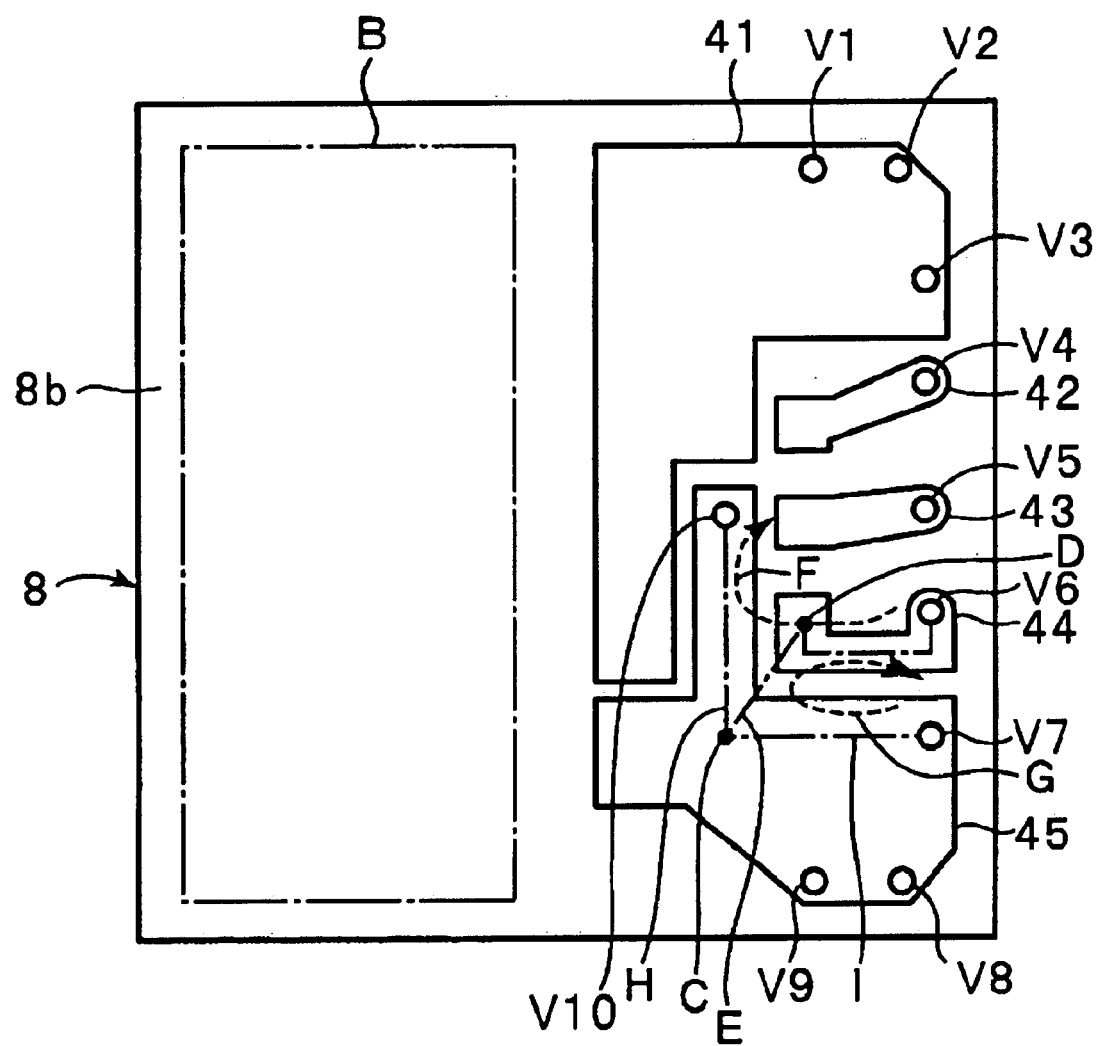
FIG. 9 is a schematic plan view illustrating wiring patterns on the upper surface of a packaging member for use in a surface acoustic wave branching filter according to a third preferred embodiment of the present invention.

FIG. 9 is a view illustrating a surface acoustic wave branching filter according to a third preferred embodiment of the present invention. Specifically, FIG. 9 is a schematic plan view showing the structures of wiring patterns on the chip-mounting surface of a packaging member for use in a third preferred embodiment and corresponds to FIG. 4 illustrated in conjunction with the first preferred embodiment of the present invention.

Because other structures in the third preferred embodiment are analogous to those in the first preferred embodiment, the description thereof will be incorporated.

In the surface acoustic wave branching filter of the third preferred embodiment, an antenna-side signal wiring pattern 42, an antenna-side ground wiring pattern 41, an interstage ground wiring pattern 43, a receiving-side signal wiring pattern 44, and a receiving-side ground wiring pattern 45 are disposed on the upper surface of the packaging member 8. Via hole electrodes V1 to V10 are arranged so as to penetrate at least one portion of the packaging member 8.

In the third preferred embodiment, the receiving-side signal wiring pattern 44 is configured preferably in the same manner as the receiving-side signal wiring pattern 24 of the first preferred embodiment. That is, the receiving-side wiring pattern 44 has a bent substantially U-shaped configuration so as to have a wiring pattern portion that is in close proximity to the receiving-side ground wiring pattern 45. Thus, as in the first preferred embodiment, the shape of the receiving-side signal wiring pattern 44 can suppress the influence of the aforementioned magnetic flux from the sending-side surface acoustic wave filter chip 3 side.

In addition, in this preferred embodiment, the via hole electrodes V10 and V7 are arranged as shown in the figure to allow the magnetic flux to be cancelled out, which further improves the attenuation and isolation. The arrangement and structures of the via hole electrodes V7 and V10 will now be described.

In FIG. 9, the via hole electrodes V7 and V10 are disposed at two opposite sides of imaginary line E that connects imaginary points C and D. The via hole electrode V10 is connected to the receiving-side ground wiring pattern 45, in the same manner as the via hole electrodes V7 and V9. The imaginary point C indicates a portion that is joined to the bump connected to the receiving-side signal terminal 7 of the surface acoustic wave filter chip 4 shown in FIG. 1. The imaginary point D indicates a portion that is joined to the bump on the electrode pad 16e connected to the ground potential of the SAW resonator P5 of the surface acoustic wave filter chip 4 shown in FIG. 1. That is, the point C is the joint of the bump that is connected to the output end of the receiving-side surface acoustic wave filter chip 4 defining the second surface acoustic wave filter chip and that is in closest proximity to the signal wiring pattern. The point D is joined to the bump connected to the ground potential of the SAW resonator that is in close proximity to the output end. The via hole electrodes V7 and V10 that are connected co ground potential are arranged on opposite sides of the imaginary line E connecting the points C and D.

During the use of the surface acoustic wave branching filter 1, when magnetic flux that has leaked from the sending side passes in the direction that is substantially perpendicular to the upper surface of the package 8, induced currents indicated by dotted lines F and G in FIG. 9 are generated in such a direction to circle around the magnetic flux. In this preferred embodiment, however, the via hole electrodes V7 and V10 are arranged at two opposite sides of the imaginary line E. In other words, current flowing to the ground potential is divided and flow into lines H and I, so that the induced currents F and G cancel each other out. Thus, it is possible to suppress the influence of the aforementioned magnetic flux and to further improve the out-of-band attenuation and isolation.

Figure 10:
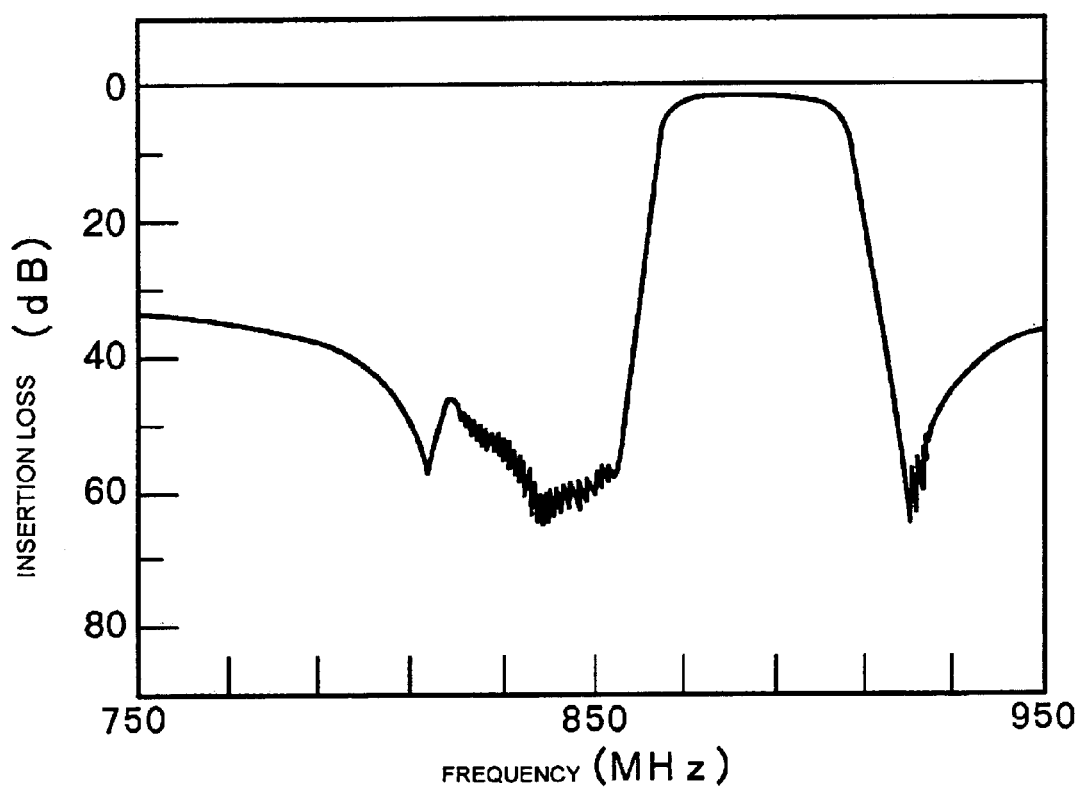
FIG. 10 is a graph showing a frequency characteristic of a receiving-side surface acoustic wave filter in the surface acoustic wave branching filter according to the third preferred embodiment of the present invention.
Figure 11:
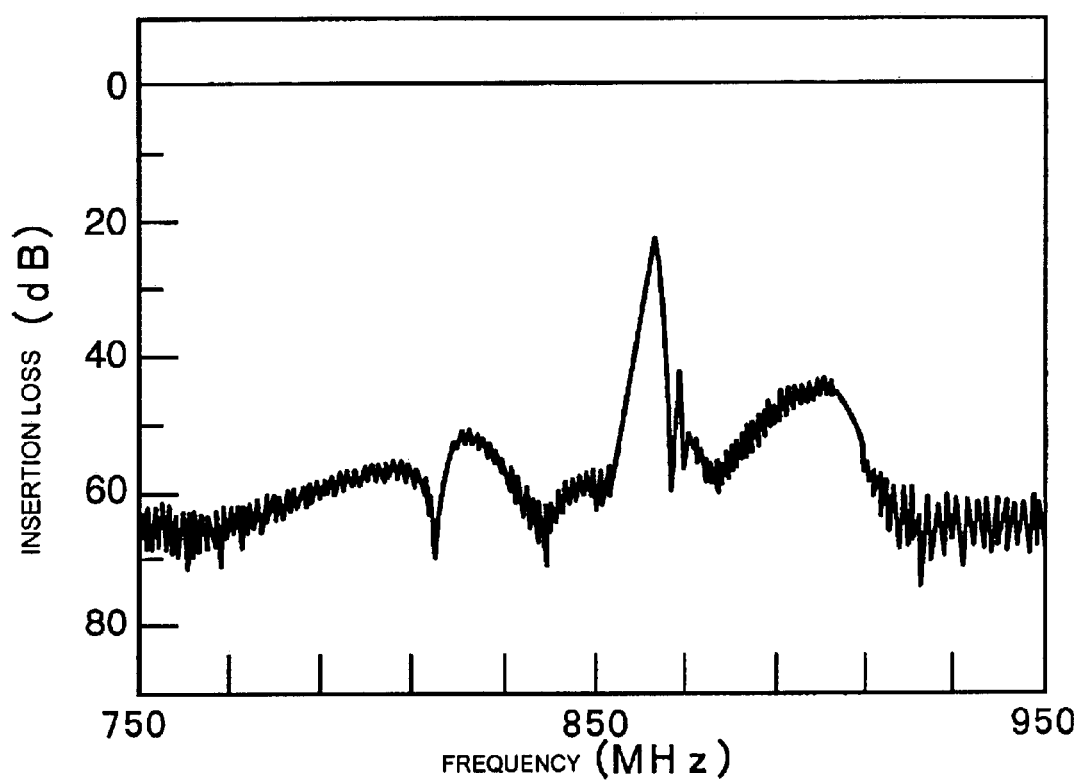
FIG. 11 is a graph showing an isolation characteristic of the receiving-side surface acoustic wave filter in the surface acoustic wave branching filter according to the third preferred embodiment of the present invention.
Figure 12:
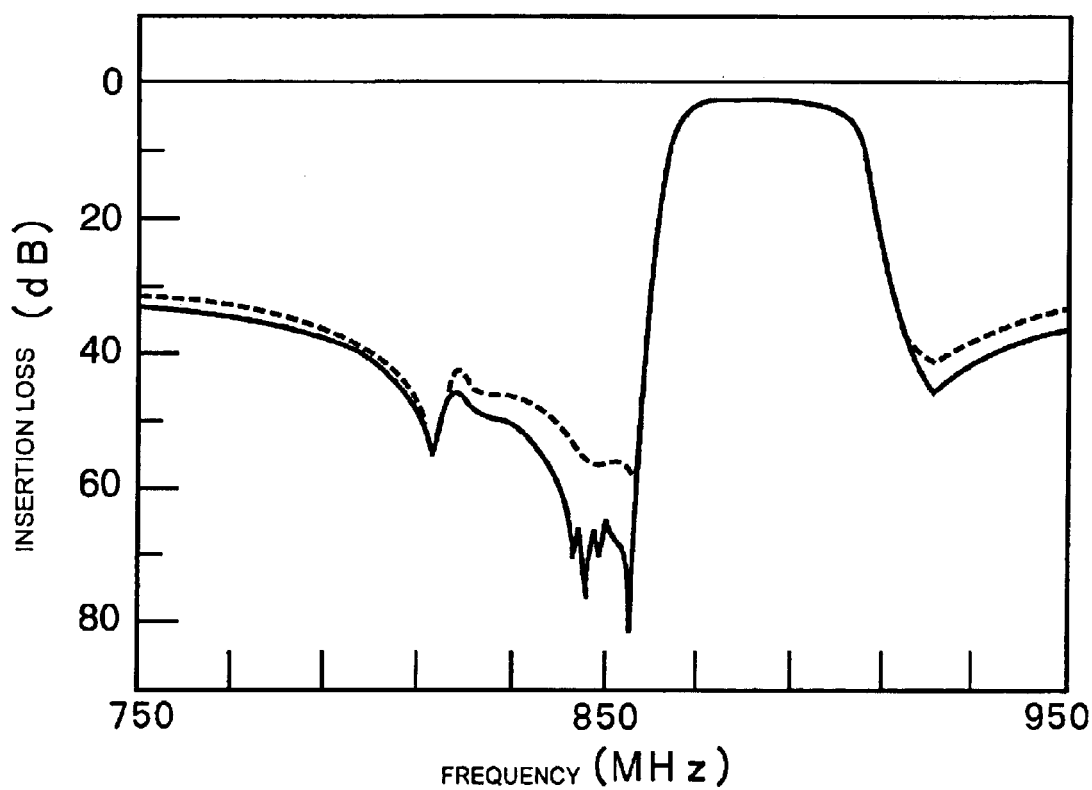
FIG. 12 is a graph showing a frequency characteristic of the receiving-side surface acoustic wave filter in the surface acoustic wave branching filter of the comparative example.
Figure 13:
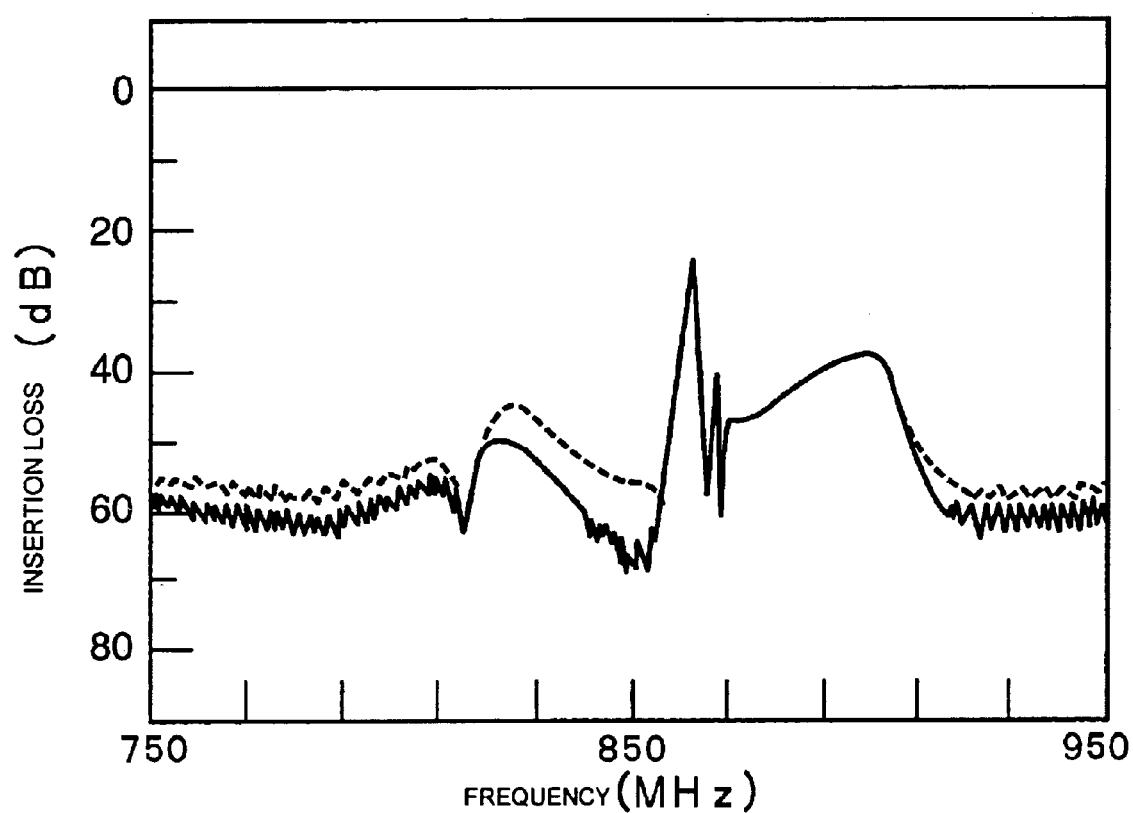
FIG. 13 is a graph showing an isolation characteristic of the receiving-side surface acoustic wave filter in the surface acoustic wave branching filter of the comparative example.

This will be described with reference to FIGS. 10 to 13. FIGS. 10 and 11 are graphs showing frequency characteristics and isolation characteristics, respectively, of the receiving side of the surface acoustic wave branching filter according to the third preferred embodiment. FIGS. 12 and 13 are graphs showing frequency characteristics and isolation characteristics of the receiving side of the surface acoustic wave branching filter of the above-described comparative example.

The mounting position of each receiving-side surface acoustic wave filter chip was displaced within the chip mounting surface in the vertical and horizontal directions by about 5 $\mu$m with the transmitting-side surface acoustic wave filter chip being fixed, and the characteristics were obtained. Of these characteristics, in FIGS. 10 to 13, the solid lines indicate the best attenuation characteristics and the best isolation characteristics, and the dotted lines indicate the worst attenuation characteristics and the worst isolation characteristics. Referring now to FIGS. 10 and 11, even when the mounting displacement of the receiving-side surface acoustic wave filter occurs, the characteristics hardly deviate. Thus, the solid line and the dotted line overlap with each other to such a degree that it is difficult to distinguish therebetween. In contrast, referring to FIGS. 12 and 13, when the mounting displacement of the receiving-side surface acoustic wave filter occurs, the attenuation and isolation characteristics deviate to a great degree, thereby increasing the difference between the solid line and the dotted line.

As is seen from the comparison between FIGS. 10, 11, 12, and 13, in the comparative example, the variation of attenuation of the receiving-side surface acoustic wave filter in the sending-side passband was 4.0 dB and the variation of the isolation in the sending-side band was 5.1 dB. In contrast, the third preferred embodiment shows a significant improvement. The attenuation of the receiving-side surface-acoustic-weave filter in the passband of the sending-side surface acoustic wave filter was about 1.2 dB and the isolation thereof in the sending-side pass band was about 0.8 dB.

As is clear from the comparison between FIGS. 10 and 11 and FIGS. 12 and 13, the third preferred embodiment shows an even more favorable isolation characteristic in a band outside of the receiving-side passband and can provide a sufficient attenuation at frequencies lower than the passband in the frequency characteristic. In the third preferred embodiment, the above-described imaginary point D is a portion that is joined to one bump on the electrode pad 16*e* connected to the ground potential of the SAW resonator P5 of the surface acoustic wave filter chip 4. A plurality of bumps, however, may be formed on the electrode pad 16*e* connected to the ground potential of the SAW resonator P5 of the surface acoustic wave filter chip 4. In such a case, the center of the plurality of bumps corresponds to the imaginary point D. That is, the bump that is connected to the ground potential of the SAW resonator 5 and that is in close proximity to the signal wiring pattern may be constituted by a plurality of bumps. In such a case, the via hole electrodes V7 and V10 may be arranged with the center point of the plurality of bumps being the imaginary point D.

Figure 14:
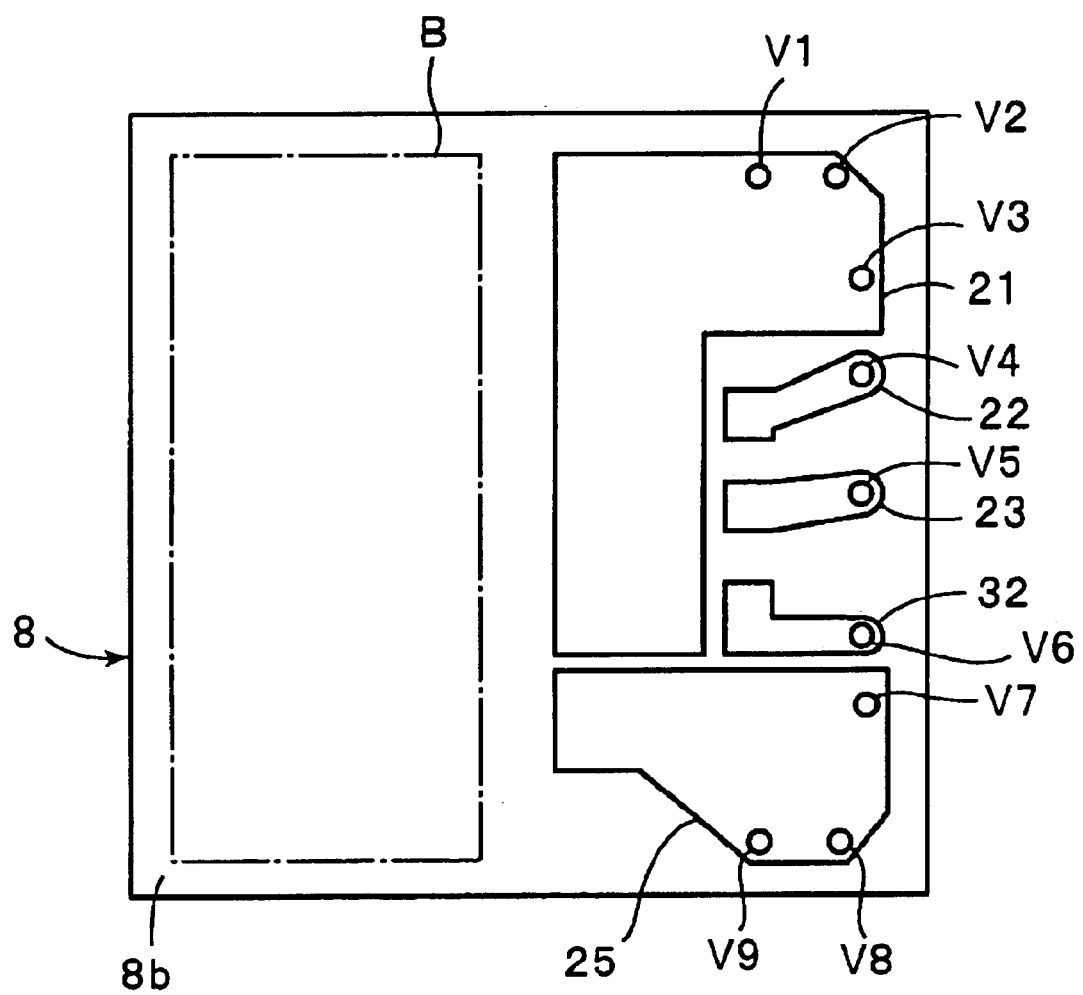
FIG. 14 is a schematic plan view illustrating a surface acoustic wave branching filter according to a fourth preferred embodiment of the present invention and illustrating wiring patterns on the upper surface of a packaging member for use therein.

FIG. 14 is a schematic plan view illustrating a surface acoustic wave branching filter according to a fourth preferred embodiment of the present invention. FIG. 14 is a schematic plan view showing the structures of electrodes on the chip mounting surface 8*b* of the packaging member 8.

The surface acoustic wave branching filter of the fourth preferred embodiment corresponds to a modification of the surface acoustic wave branching filter described above in the second preferred embodiment. Thus, as shown in FIG. 8, in the second preferred embodiment, the receiving-side signal wiring pattern 31 has a substantially linear shape and is connected to the via hole electrode V6 at the outer end. Although the signal wiring pattern 31 is formed to have a substantially linear shape in the second preferred embodiment, an L-shaped signal wiring pattern, as shown in FIG. 14, may be formed as the receiving-side signal wiring pattern 32. In this case, similarly, the receiving-side signal wiring pattern 32 is connected to the via hole electrode V6 at the outer end. Among the distances between pairs of via hole electrodes that are connected to different potentials, the distance between the via hole electrode V6 and the via hole electrode V7 that is connected to the receiving-side ground wiring pattern 25 is set to be a minimum, as in the second preferred embodiment. Thus, similarly to the second preferred embodiment, this preferred embodiment also can increase the attenuation of the receiving-side surface acoustic wave filter and improve the isolation.

Figure 15:
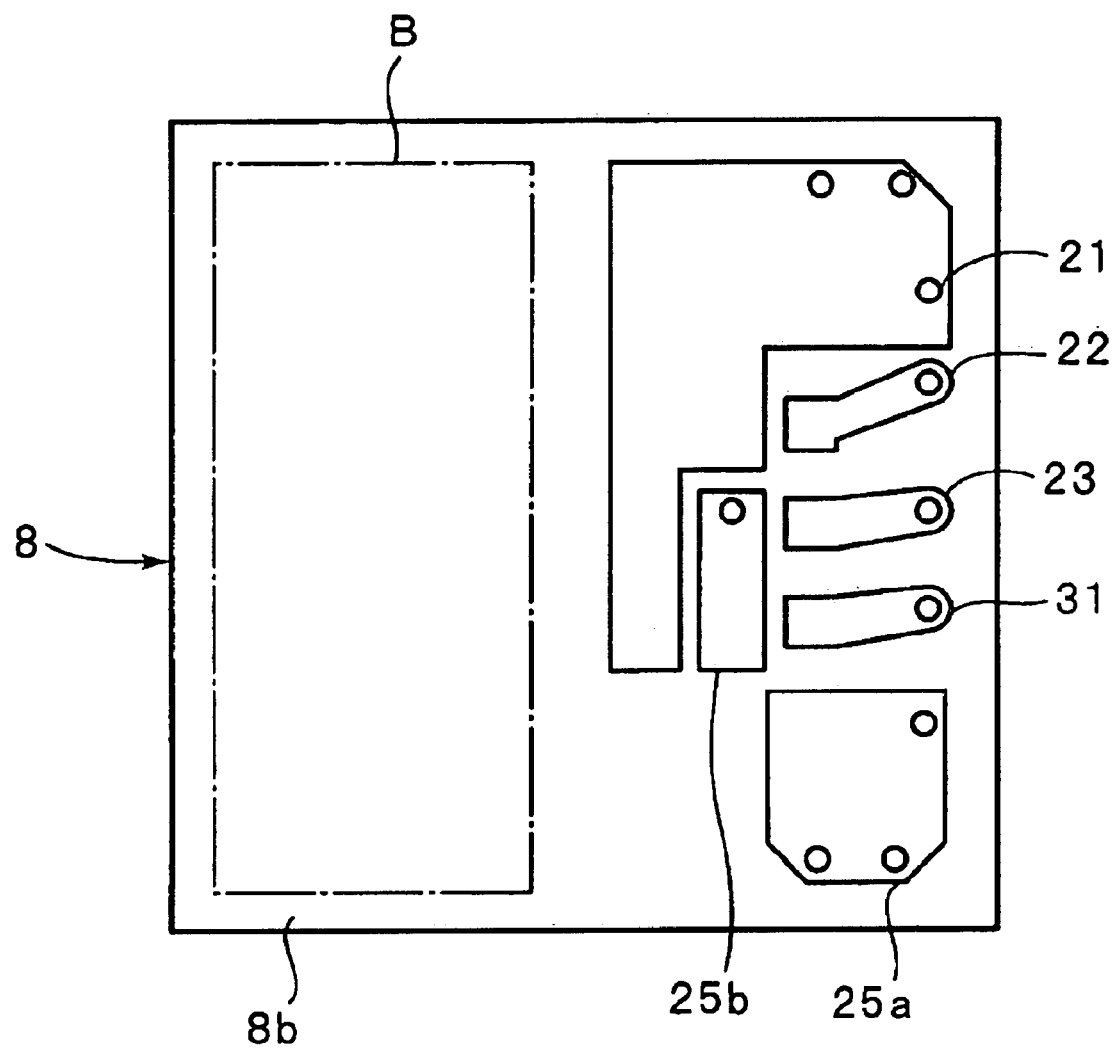
FIG. 15 is a schematic plan view illustrating wiring patterns on the upper surface of a packaging member for use in a surface acoustic wave branching filter according to a modification of the third preferred embodiment of the present invention.
Figure 16:
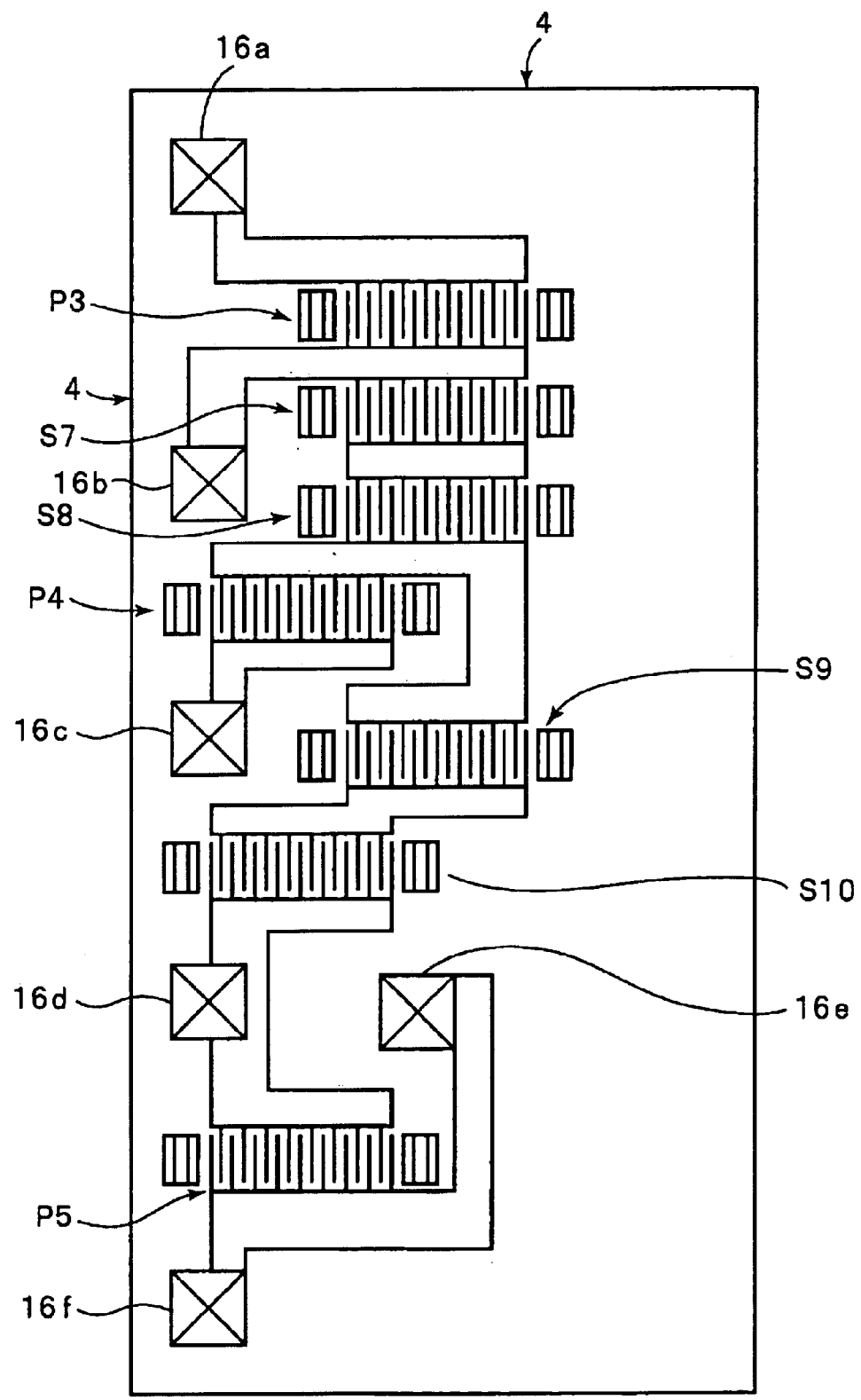
FIG. 16 is a bottom view of a receiving-side surface acoustic wave filter chip to be mounted on the upper surface of the packaging member shown in FIG. 15.

FIGS. 15 and 16 are views illustrating another modification of the first preferred embodiment of the present invention. FIG. 15 is a view showing the shape of wiring patterns on the upper surface of a pattern member for use in this modification. FIG. 16 is a schematic bottom view showing the shapes of electrodes on the lower surface of the surface acoustic wave filter chip 4 for use in this modification.

While the receiving-side ground wiring pattern 25 includes one electrode in the first preferred embodiment, the receiving-side ground wiring pattern 25 may be separated into a ground wiring pattern 25*a* and a ground wiring pattern 25*b*, as shown in FIG. 15. Thus, similarly, in each of the first, second, and third preferred embodiments, the receiving-side ground wiring pattern may be separated into a plurality of wiring patterns.

Figure 17:
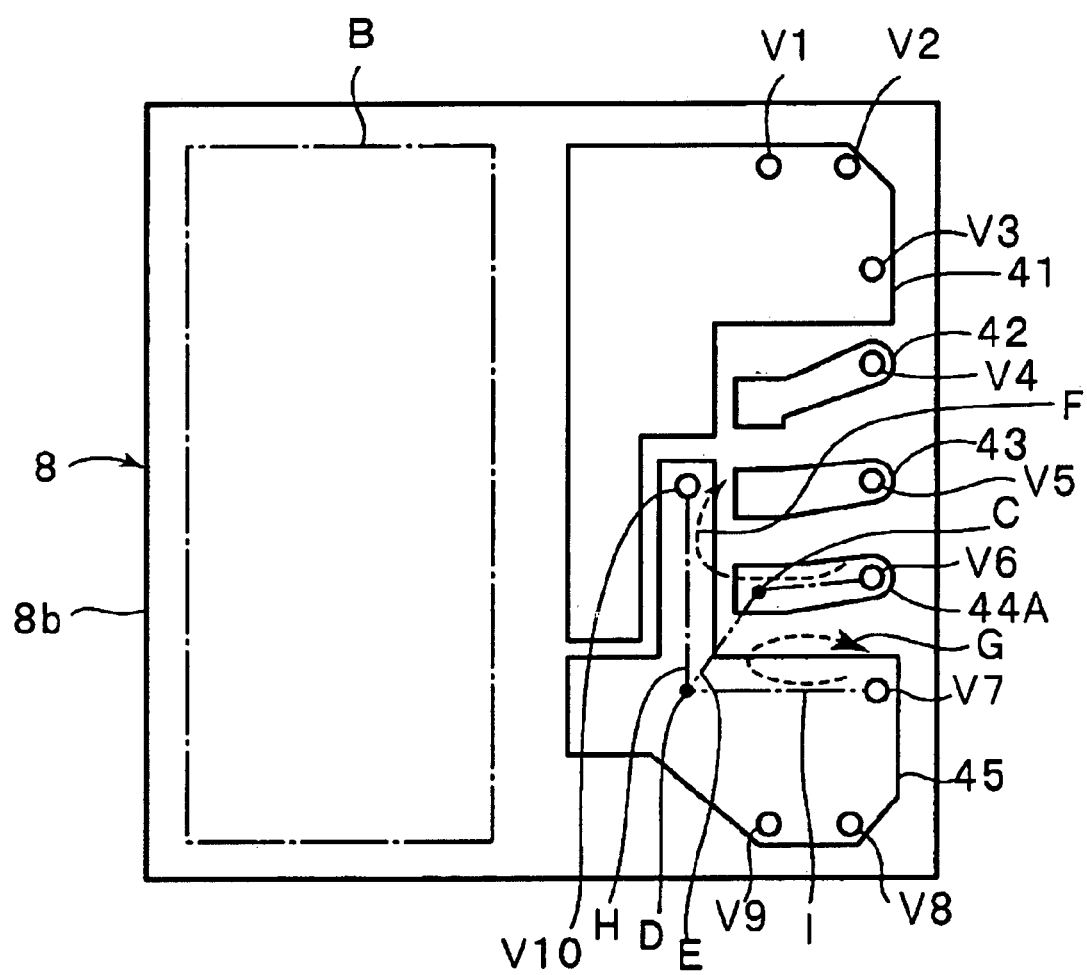
FIG. 17 is a schematic plan view illustrating wiring patterns on the upper surface of a packaging member for use in a surface acoustic wave branching filter according to a modification of the third preferred embodiment of the present invention.

FIG. 17 is a view illustrating a surface acoustic wave branching filter according to a modification of the surface acoustic wave branching filter of the third preferred embodiment described above. FIG. 17 is a view corresponding to FIG. 9 in which the third preferred embodiment is illustrated.

The surface acoustic wave branching filter in this modification is configured in the same manner as the surface acoustic wave branching filter of the third preferred embodiment, except that the receiving-side wiring pattern 44 does not have a substantially U-shaped configuration. Thus, in the surface acoustic wave branching filter of the third preferred embodiment, the receiving-side wiring pattern 44A has been brought into close proximity to the receiving-side ground wiring pattern 45 to have a substantially U-shaped configuration, as in the first preferred embodiment.

In contrast, in the surface acoustic wave branching filter of this modification, a receiving-side wiring pattern 44A does not have a substantially U-shaped configuration. In this preferred embodiment, as in the surface acoustic wave branching filter of the third preferred embodiment, the via hole electrode V10 and the via hole electrode V7 are arranged as shown in the figure. This arrangement can cancel out the influence of magnetic flux from the sending-side surface acoustic wave filter chip 3 side to thereby improve the attenuation and isolation.

Thus, as shown in FIG. 17, in which the shape of the receiving-side signal wiring pattern is changed in the third preferred embodiment, arrangement of the via hole electrodes V7 and V10 as shown can improve the attenuation and isolation, but not as much as compared to the third preferred embodiment.

Figure 18:
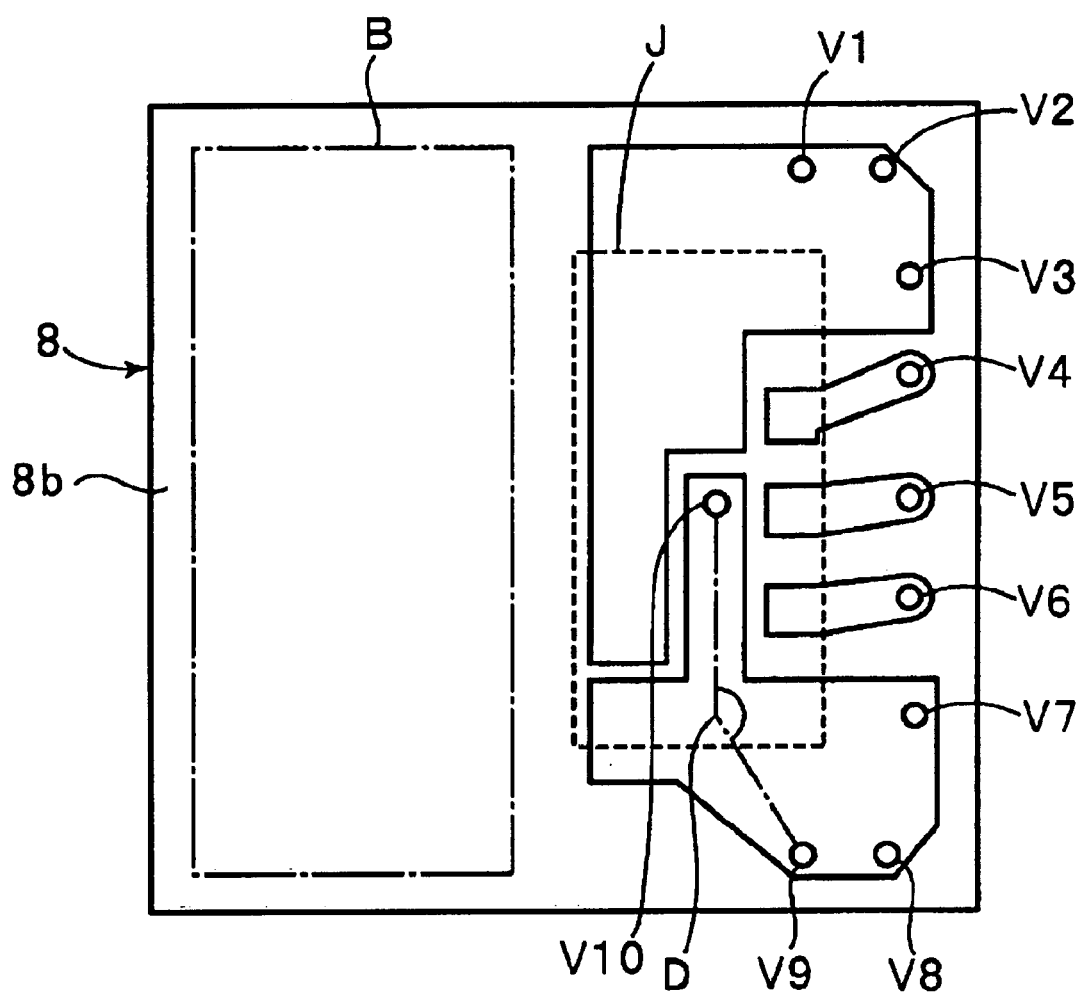
FIG. 18 is a schematic plan view illustrating the positional relationships of a plurality of via hole electrodes that is connected to a receiving-side ground wiring pattern to enhance grounding, in the wiring patterns shown in FIG. 17.
Figure 19:
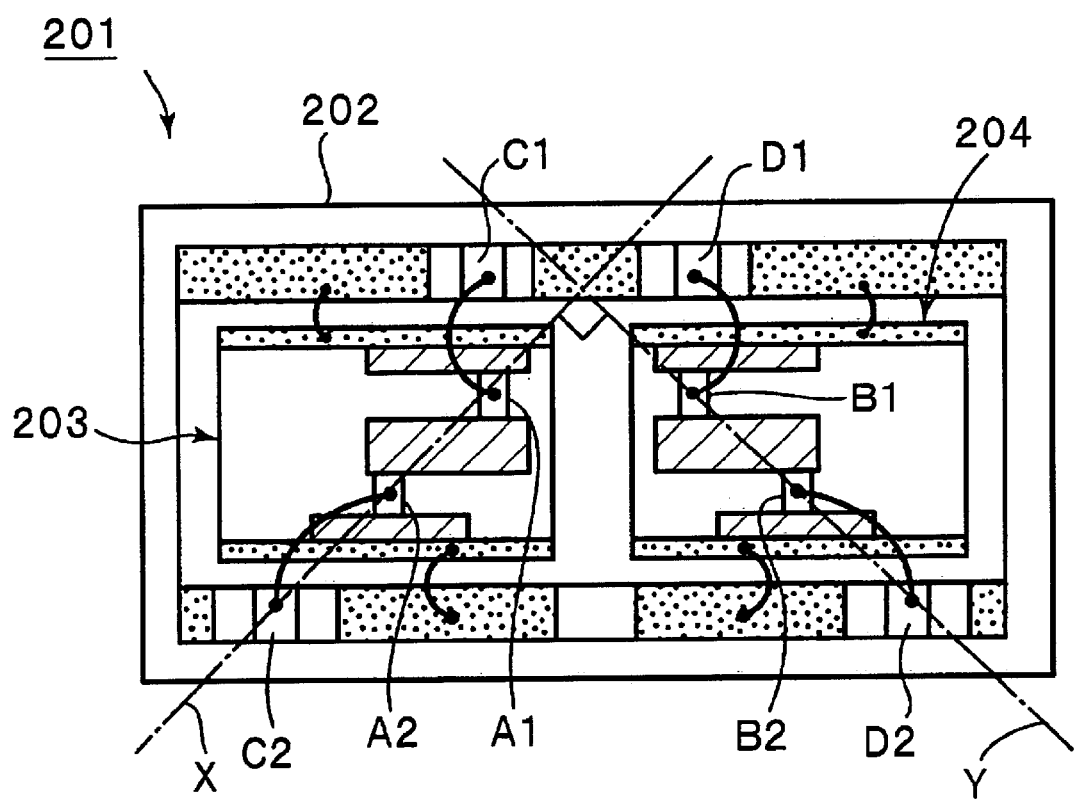
FIG. 19 is a schematic plan sectional plan illustrating a conventional surface acoustic wave branching filter.
Figure 20:
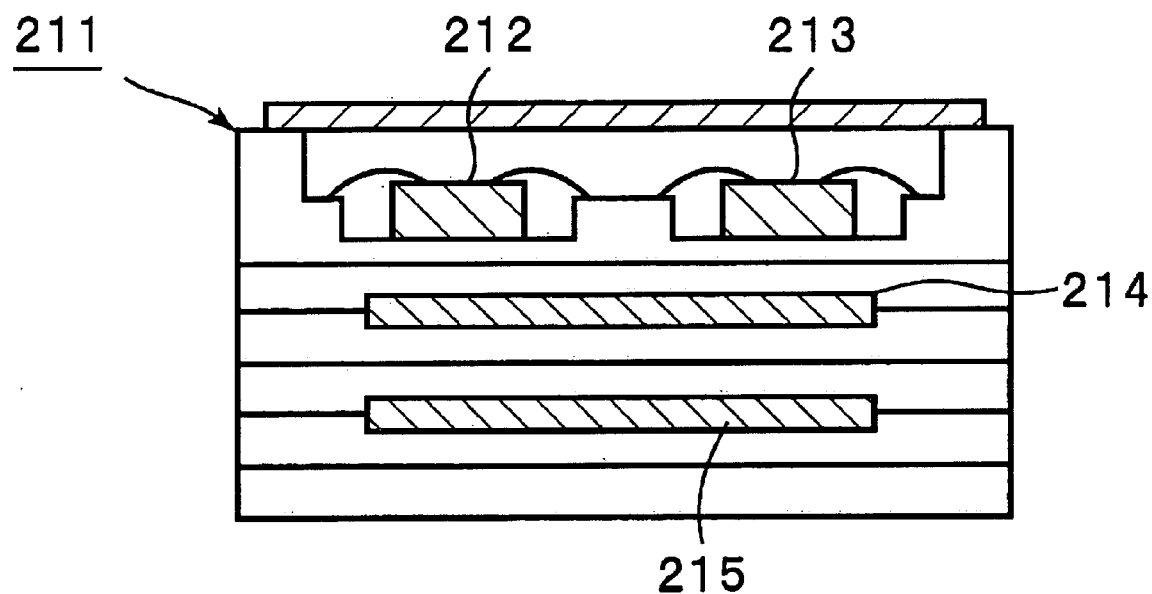
FIG. 20 is a schematic front sectional view illustrating another conventional surface acoustic wave branching filter.

In addition, as schematically shown in FIG. 18, in the modification shown in FIG. 17, on the surface to which a bump for a receiving-side ground wiring pattern is joined, the angle formed by a line connecting the imaginary point D and the via hole electrode V7 that is connected to a receiving-side ground wiring pattern and a line connecting the imaginary point D and the via hole electrode V10 that is connected to another ground wiring pattern is about 90° or more. As a result, grounding in the receiving-side ground wiring pattern is enhanced.

The dotted line J shown in FIG. 18 indicates a region in which the surface acoustic wave filter chip 4 is mounted on the chip mounting surface 8*b* of the packaging member 8. As is clear from FIG. 18, the via hole electrodes V1 to V9 are distributed around the region in which the receiving-side surface acoustic wave filter chip 4 is mounted. The via hole electrode V10 is arranged in the region in which the surface acoustic wave filter chip 4 is mounted and other via hole electrodes V7 to V9 that are connected to ground potential are arranged in a region other than that region. In this manner, at least one via hole electrode V10 is preferably arranged in the region in which the surface acoustic wave filter chip 4 is mounted and the other via-hole electrodes V1 to V9 are preferably arranged in a region outside the region in which the surface acoustic wave filter chip 4 is mounted. With this arrangement, while the first and second surface acoustic wave filter chips 3 and 4 in the preferred embodiments and modifications described above are configured as separate chips, the first and second surface acoustic wave filter chips 3 and 4 may be integrated and configured as a single chip.

In a surface acoustic wave branching filter according to a first preferred embodiment of the present invention, a signal wiring pattern that is disposed on a chip mounting surface of a packaging member is configured to have a pattern portion that is in closer proximity to a ground wiring pattern than to a bump of a second surface acoustic wave filter chip that is connected to the signal wiring pattern. Thus, it is possible to suppress magnetic flux, caused by a signal flowing through a first surface acoustic wave filter chip, from passing through a portion at which the ground wiring pattern and the signal wiring pattern that is connected to the second surface acoustic wave filter chip are provided. Thus, it is possible to improve the isolation characteristic in a band out of the passband of the second surface acoustic wave filter and to provide a sufficient out-of-band attenuation for the second surface acoustic wave filter.

The signal wiring pattern may be bent so as to be in close proximity to the ground wiring pattern to thereby provide the aforementioned pattern portion that is in close proximity to the ground electrode pattern. In this case, only configuring the plan shape of the signal wiring pattern can improve the isolation of the second surface acoustic wave filter side according to the first preferred embodiment of the present invention.

The signal wiring pattern may have a first wiring pattern portion that extends substantially parallel to an edge of the ground wiring pattern at a portion in close proximity to the ground wiring pattern and second and third wiring pattern portions that are bent from two opposite ends of the first wiring pattern portion in a direction away from the ground wiring pattern. In this case, forming the signal wiring pattern to have such a substantially U-shaped configuration can improve the out-of-band isolation of the second surface acoustic wave filter according to the first preferred embodiment of the present invention.

At the second or third wiring pattern portion, the signal wiring pattern may be electrically connected to the output end of the second surface acoustic wave filter chip via a bump. In this case, even when the first wiring pattern portion is brought into close proximity to the ground wiring pattern to improve the isolation, it is possible to arrange the joint portion of the signal wiring pattern with a bump away from the ground wiring pattern. Thus, it is possible to easily join the second surface acoustic wave filter to the packaging member with a bump. In addition, a via hole electrode connected to the second or third wiring pattern portion may be formed in the packaging member at the second or third wiring pattern portion. In this case, the via hole electrode and a via hole electrode that is connected to the ground-side wiring pattern can be spaced apart from each other. Thus, for miniaturization, the distance between both the via hole electrodes can be made large enough, thereby facilitating the formation of the via hole electrodes.

In a surface acoustic wave branching filter according to a second preferred embodiment of the present invention, the chip mounting surface of the packaging member has, at least, a signal wiring pattern that is connected to an output end of the second surface acoustic wave filter chip and a ground wiring pattern that is connected to a ground potential of a SAW resonator that is in closest proximity to the output end of the second surface acoustic wave filter chip. The chip mounting surface has a signal via hole electrode and a ground via hole electrode which are connected to the signal wiring pattern and the ground wiring pattern, respectively, and which penetrate at least one portion of the packaging member. Of the distances between via hole electrodes that are arranged in the packaging member and that are connected to different potentials, the distance between the signal via hole electrode and the ground via hole electrode is a minimum. As in the first invention, this arrangement can suppress the influence due to magnetic flux that is caused by a current that flows through the first surface acoustic wave filter chip and that passes through the region in which the signal wiring pattern and the ground wiring pattern are provided. Thus, it is possible to improve the out-of-band isolation of the second surface acoustic wave filter chip and to substantially improve the frequency characteristics of the second surface acoustic wave filter.

In a surface acoustic wave branching filter according to the third preferred embodiment of the present invention, the chip mounting surface of the packaging member has, at least, a signal wiring pattern that is connected to an output end of the second surface acoustic wave filter chip and a ground wiring pattern that is connected to a ground potential of a SAW resonator that is in closest proximity to the output end of the second surface acoustic wave filter chip. A structure for canceling out magnetic flux is provided. When magnetic flux, produced by an electrical signal flowing through the first surface acoustic wave filter chip, flows in a region in which the signal wiring pattern and the ground wiring pattern are provided, the structure cancels out the magnetic flux. In this case, as in the first preferred embodiment of the present invention, it is possible to improve the out-of-band isolation of the second surface acoustic wave filter chip and to improve the frequency characteristics of the second surface acoustic wave filter chip.

In the third preferred embodiment of the present invention, the structure for canceling out the magnetic flux may be a structure in which first and second via hole electrodes are arranged to penetrate at least one portion of the packaging member, are connected to the ground wiring pattern, and are arranged at two opposite sides of an imaginary line that connects a first bump and a second bump of a plurality of bumps that join the second surface acoustic wave filter chip to the packaging member. The first bump is connected to the output end of the second surface acoustic wave filter chip and the second bump is connected to the ground potential of the SAW resonator that is in closest proximity to the output end. In this case, only adjusting the formation position of the first and second via hole electrodes can easily provide the structure for canceling out magnetic flux.

The structure for canceling out the magnetic flux may be a structure in which first and second via hole electrodes are arranged to penetrate a layer of at least one portion of the packaging member and are connected to the ground wiring pattern. The first and second via hole electrodes are distributed at two opposite sides of a line that connects, of the plurality of bumps that are provided on the second surface acoustic wave filter chips, a first bump and the center of a plurality of second bumps. The first bump is connected to the output end of the second surface acoustic wave filter chip and the second bumps is connected to the ground potential of the SAW resonator that is in closest proximity to the output end of the second surface acoustic wave filter chip. In this case, similarly, only adjusting the positions of the first and second via hole electrodes can easily arrange the structure for canceling out magnetic flux in the packaging member.

The angle that is formed by a line connecting the first via hole electrode and the second bump and a line connecting the second bump and the second via hole electrode may be about 90° or more. This enhances grounding at a portion at which the second surface acoustic wave filter chip is mounted in the packaging member.

The angle that is formed by a line connecting the first via hole electrode and the center of the plurality of second bumps and a line connecting the center of the plurality of second bumps and the second via hole electrode may be about 90° or more. This similarly enhances grounding at a portion at which the ground wiring pattern is provided.

A plurality of via hole electrodes including the first and second via hole electrodes may be provided in the packaging member. A least one of the plurality of via hole electrodes is arranged in a region in which the second surface acoustic wave filter chip is mounted and the other via hole electrodes are arranged in a region outside a surface on which the second surface acoustic wave filter chip is mounted. This can enhance grounding.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave branching filter in which a first surface acoustic wave filter chip having a relatively low center frequency and a second surface acoustic wave filter chip having a relatively high center frequency are joined via a plurality of bumps provided on the first and second surface acoustic wave filter chips to wiring patterns formed on a chip-mounting surface of a packaging member, the surface acoustic wave branching filter comprising:

the first surface acoustic wave filter chip including a plurality of SAW resonators and a plurality of bumps on the lower surface thereof;

the second surface acoustic wave filter chip including a plurality of SAW resonators and a plurality of bumps on the lower surface thereof; and the packaging member to which the first and second surface acoustic wave filter chips are joined using the plurality of bumps; wherein the chip mounting surface of the packaging member includes:

a signal wiring pattern that is connected to an output end of the second surface acoustic wave filter chip;

a ground wiring pattern that is connected to a ground potential of a SAW resonator that is in closest proximity to the output end of the second surface acoustic wave filter chip;

a signal via hole electrode and a ground via hole electrode which are connected to the signal wiring pattern and the ground wiring pattern, respectively, and which penetrate at least one portion of the packaging member; and the signal wiring pattern includes a pattern portion that is in closer proximity to the ground wiring pattern than to the bump joined to the signal wiring pattern of the second surface acoustic wave filter chip.

2. A surface acoustic wave branching filter according to claim 1, wherein the signal wiring pattern is bent so that the pattern portion is in close proximity to the ground wiring pattern.

3. A surface acoustic wave branching filter according to claim 2, wherein the signal wiring pattern includes a first wiring pattern portion at the portion that is in close proximity to the ground wiring pattern, a second wiring pattern portion, and a third wiring pattern portion, the first wiring pattern portion extending substantially parallel to an edge of the ground wiring pattern and the second and third wiring pattern portions being bent from two opposite ends of the first wiring pattern portion in a direction away from the ground wiring pattern.

4. A surface acoustic wave branching filter according to claim 3, wherein the second or third wiring pattern portion of the signal wiring pattern is electrically connected to the output end of the second surface acoustic wave filter chip via the bump.

5. A surface acoustic wave branching filter according to claim 1, wherein a plurality of via hole electrodes is disposed on the packaging member;

at least one of the plurality of via hole electrodes is disposed under the surface on which the second surface acoustic wave filter chip is mounted; and the other via hole electrodes are disposed in a region outside the region in which the second surface acoustic wave filter chip is mounted.

6. A surface acoustic wave device according to claim 1, wherein the first and second surface acoustic wave filter chips are integrated and configured as one chip.

7. A surface acoustic wave branching filter in which a first surface acoustic wave chip filter having a relatively low center frequency and a second surface acoustic wave chip filter having a relatively high center frequency are joined using a plurality of bumps provided on the first and second surface acoustic wave filter chips to wiring patterns of a chip-mounting surface of a packaging member, the surface acoustic wave branching filter including:

the first surface acoustic wave filter chip that includes a plurality of SAW resonators and that has a plurality of bumps on the lower surface;

the second surface acoustic wave filter chip that includes a plurality of SAW resonators and that has a plurality of bumps on the lower surface; and the packaging member to which the first and second surface acoustic wave filter chips are joined using the plurality of bumps; wherein the chip mounting surface of the packaging member includes:

a signal wiring pattern that is connected to an output end of the second surface acoustic wave filter chip;

a ground wiring pattern that is connected to a ground potential of a SAW resonator that is in closest proximity to the output end of the second surface acoustic wave filter chip; and a signal via hole electrode and a ground via hole electrode which are connected to the signal wiring pattern and the ground wiring pattern, respectively, and which penetrate at least one portion of the packaging member; and the distance between the signal via hole electrode and the ground via hole electrode is the minimum of the distances between via hole electrodes that are arranged in the packaging member and that are connected to different potentials.

8. A surface acoustic wave branching filter according to claim 7, wherein a plurality of via hole electrodes is disposed on the packaging member;

at least one of the plurality of via hole electrodes is disposed in the region of the packaging member on which the second surface acoustic wave filter chip is mounted; and the other via hole electrodes are disposed in a region outside the region in which the second surface acoustic wave filter chip is mounted.

9. A surface acoustic wave device according to claim 7, wherein the first and second surface acoustic wave filter chips are integrated and configured as one chip.

10. A surface acoustic wave branching filter in which a first surface acoustic wave filter chip having a relatively low center frequency and a second surface acoustic wave filter chip having a relatively high center frequency are joined using a plurality of bumps provided on the first and second surface acoustic wave filter chips to wiring patterns of a chip-mounting surface of a packaging member, the surface acoustic wave branching filter including:

the first surface acoustic wave filter chip that includes a plurality of SAW resonators and that has a plurality of bumps on the lower surface;

the second surface acoustic wave filter chip that includes a plurality of SAW resonators and that has a plurality of bumps on the lower surface; and the packaging member to which the first and second surface acoustic wave filter chips are joined using the plurality of bumps; wherein the chip mounting surface of the packaging member includes:

a signal wiring pattern that is connected to an output end of the second surface acoustic wave filter chip;

a ground wiring pattern that is connected to a ground potential of a SAW resonator that is in closest proximity to the output end of the second surface acoustic wave filter chip; and a structure for canceling out magnetic flux generated by the signals flowing through the first surface acoustic wave filter in a region in which the signal wiring pattern and the ground wiring pattern are located.

11. A surface acoustic wave branching filter according to claim 10, wherein the second surface acoustic wave filter chip includes:

a first bump connected to the output end of the second surface acoustic wave filter chip; and a second bump connected to the ground potential of the SAW resonator that is in closest proximity to the output end of the second surface acoustic wave filter chip; and the structure for canceling out the magnetic flux includes first and second via hole electrodes which are arranged to penetrate at least one portion of the packaging member, which are connected to the ground wiring pattern, and which are distributed at two opposite sides of an imaginary line that connects the first bump and the second bump.

12. A surface acoustic wave branching filter according to claim 11, wherein the angle defined by a line connecting the first via hole electrode and the second bump and a line connecting the second bump and the second via hole electrode is about 90° or greater.

13. A surface acoustic wave branching filter according to claim 10, wherein the second surface acoustic wave filter chip includes:

a first bump connected to the output end of the second surface acoustic wave filter chip; and a plurality of second bumps connected to the ground potential of the SAW resonator that is in closest proximity to the output end of the second surface acoustic wave filter chip; and the structure for canceling out the magnetic flux includes first and second via hole electrodes which are arranged to penetrate a layer of at least one portion of the packaging member, which are connected to the ground wiring pattern, and which are distributed on two opposite sides of a line that connects the first bump and a center of the plurality of second bumps.

14. A surface acoustic wave branching filter according to claim 13, wherein the angle defined by a line connecting the first via hole electrode and the center of the plurality of second bumps and a line connecting the center of the plurality of second bumps and the second via hole electrode is about 90° or greater.

15. A surface acoustic wave branching filter according to claim 10, wherein a plurality of via hole electrodes is disposed on the packaging member;

at least one of the plurality of via hole electrodes is disposed in the region of the packaging member on which the second surface acoustic wave filter chip is mounted; and the other via hole electrodes are disposed in a region outside the region in which the second surface acoustic wave filter chip is mounted.

16. A surface acoustic wave device according to claim 10, second surface acoustic wave filter chips are integrated and configured as one chip.

\* \* \* \* \*